United States Patent
Aizawa et al.

(10) Patent No.: US 9,772,373 B2
(45) Date of Patent: Sep. 26, 2017

(54) HANDLER APPARATUS, DEVICE HOLDER, AND TEST APPARATUS

(71) Applicant: ADVANTEST CORPORATION, Tokyo (JP)

(72) Inventors: Mitsunori Aizawa, Saitama (JP); Yuya Yamada, Gunma (JP)

(73) Assignee: ADVANTEST CORPORATION, Tokyo (JP)

( * ) Notice: Subject to any disclaimer, the term of this patent is extended or adjusted under 35 U.S.C. 154(b) by 131 days.

(21) Appl. No.: 14/472,385

(22) Filed: Aug. 29, 2014

(65) Prior Publication Data
US 2015/0276860 A1   Oct. 1, 2015

(30) Foreign Application Priority Data
Mar. 25, 2014   (KR) .................. 10-2014-0034408

(51) Int. Cl.
*G01R 31/00* (2006.01)
*G01R 31/28* (2006.01)
(Continued)

(52) U.S. Cl.
CPC ....... *G01R 31/2887* (2013.01); *G01R 1/0433* (2013.01); *G01R 31/043* (2013.01); *G01R 31/2891* (2013.01); *G01R 31/2893* (2013.01)

(58) Field of Classification Search
CPC  G01R 31/0483; G01R 31/0466; G01R 31/28; G01R 31/2887; G01R 31/2896;
(Continued)

(56) References Cited

U.S. PATENT DOCUMENTS

| 5,320,550 A | 6/1994 | Uratsuji et al. |
| 5,486,771 A | 1/1996 | Volz et al. |

(Continued)

FOREIGN PATENT DOCUMENTS

| JP | H07-221171 A | 8/1995 |
| JP | 2973406 B1 | 9/1999 |

(Continued)

OTHER PUBLICATIONS

Office Action issued for counterpart Korean Application 10-2015-0035774, issued by the Korean Intellectual Property Office on Mar. 18, 2016.
(Continued)

*Primary Examiner* — Thang Le

(57) ABSTRACT

Provided is a handler apparatus that conveys a device under test to a test socket, including: an actuator that, prior to fitting of a device holder to the test socket, fits the device holder, and adjusts a position of the device under test on the device holder; and a conveyer that conveys the device holder in which a position of the device under test has been adjusted, to fit the test socket, where the device holder includes: an inner unit to mount the device under test; an outer unit to retain the inner unit to be movable; and a release button to release a lock of movement of the inner unit, in response to being pressed from a side to which the device under test is mounted, and the actuator sets the inner unit to be movable by pressing the release button and adjusts a position of the inner unit.

10 Claims, 24 Drawing Sheets

(51) Int. Cl.
  *G01R 1/04* (2006.01)
  *G01R 31/04* (2006.01)
(58) Field of Classification Search
  CPC ............ G01R 31/2886; G01R 31/0433; G01R 31/2893; G01R 31/2891; G01R 31/2851; G01R 31/043; G01R 1/0416; G01R 1/0441; G01R 1/0466; G01R 1/7342; G01R 1/06705; G01R 1/06794; G01R 1/07314; G01R 1/06711; G01R 1/06772; G01R 1/06738; G01R 1/07342; G01R 31/31924; G01R 31/3004; G01R 31/2884; G01R 31/31922
  USPC .................. 324/750.19, 750.22–750.25, 324/756.01–756.03, 755.22, 754.01, 324/754.03, 754.07–754.11, 754.13, 324/754.14, 757.03, 755.01, 755.11, 324/762.01–762.05, 757.01–757.05
  See application file for complete search history.

(56) References Cited

U.S. PATENT DOCUMENTS

| | | | |
|---|---|---|---|
| 6,257,319 B1 | 7/2001 | Kainuma et al. | |
| 7,563,144 B2 | 7/2009 | Kunioka et al. | |
| 7,830,164 B2 | 11/2010 | Earle et al. | |
| 8,033,854 B1 | 10/2011 | Gattuso et al. | |
| 8,062,043 B2* | 11/2011 | Chen | H05K 7/1007 439/266 |
| 9,285,393 B2 | 3/2016 | Kikuchi et al. | |
| 2002/0177347 A1* | 11/2002 | Ogura | H01R 13/2421 439/330 |
| 2004/0077200 A1* | 4/2004 | Ishikawa | G01R 1/0458 439/190 |
| 2006/0228915 A1 | 10/2006 | Sato et al. | |
| 2007/0270015 A1 | 11/2007 | Morinari | |
| 2008/0020623 A1 | 1/2008 | Wooden | |
| 2008/0238460 A1* | 10/2008 | Kress | G01R 31/2891 324/756.02 |
| 2011/0041311 A1 | 2/2011 | Hofmann et al. | |
| 2011/0041312 A1 | 2/2011 | Hofmann | |
| 2011/0156734 A1* | 6/2011 | Berry | G01R 31/2891 324/750.19 |
| 2012/0034052 A1 | 2/2012 | Yamazaki et al. | |
| 2013/0181576 A1* | 7/2013 | Shiozawa | H02N 2/0095 310/323.17 |
| 2013/0181733 A1* | 7/2013 | Kikuchi | G01R 1/0466 324/750.03 |
| 2013/0181734 A1* | 7/2013 | Horino | G01R 31/2891 324/750.04 |
| 2014/0190047 A1* | 7/2014 | McCoy | D05B 11/00 38/102.91 |

FOREIGN PATENT DOCUMENTS

| | | |
|---|---|---|
| JP | 2000-147055 A | 5/2000 |
| KR | 10-1077940 B1 | 10/2011 |

OTHER PUBLICATIONS

Office Action issued for counterpart Japanese Application 2015-043781, issued by the Japan Patent Office on Feb. 9, 2016.
Office Action issued for counterpart Japanese Application 2015-043781, issued by Japan Patent Office on Aug. 16, 2016.
Office Action issued for counterpart Taiwanese Application 104107618, issued by the Taiwan Intellectual Property Office dated Nov. 11, 2016.
Office Action issued for counterpart Korean Application 10-2015-0048157, issued by the Korean Intellectual Property Office dated Nov. 21, 2016.
Notice of First Office Action for Patent Application No. 201510115401.6, issued by The State Intellectual Property Office of Peoples' Republic of China dated Jan. 23, 2017.
Office Action for the related U.S. Appl. No. 14/659,580, issued by United States Patent And Trademark Office dated Feb. 3, 2017.
Office Action issued for related U.S. Appl. No. 14/659,580 issued by the United States Patent and Trademark Office's dated Jul. 20, 2017.

* cited by examiner

HANDLER APPARATUS, DEVICE HOLDER, AND TEST APPARATUS

BACKGROUND

1. Technical Field

The present invention relates to a handler apparatus, a device holder, and a test apparatus.

2. Related Art

Conventionally, a handler apparatus connected to a test apparatus for testing a device under test electrically connects a device under test to the test apparatus, by causing a device holder retaining the device under test to fit a socket of the test apparatus (e.g., please refer to Patent Documents No. 1 to No. 5).

Patent Document 1: Japanese Patent Application Publication No. 2000-147055
Patent Document 2: Japanese Patent Application Publication No. 2000-46902
Patent Document 3: Japanese Patent Application Publication No. 2009-2860
Patent Document 4: Japanese Patent Application Publication No. 2011-39059
Patent Document 5: Japanese Patent Application Publication No. 2011-40758

However, if the relative position of the electrode of the device under test does not correspond to the position of the electrode of the test socket, there have been cases in which the device under test cannot be electrically connected to the test socket even by fitting the device holder to the test socket.

SUMMARY

Therefore, it is an object of an aspect of the innovations herein to provide a handler apparatus and a test apparatus, which are capable of overcoming the above drawbacks accompanying the related art. The above and other objects can be achieved by combinations described in the claims. According to a first aspect related to the innovations herein, provided is a handler apparatus that conveys a device under test to a test socket, including: an actuator that, prior to fitting of a device holder retaining the device under test to the test socket, fits the device holder, and adjusts a position of the device under test on the device holder; and a conveyer that conveys the device holder in which a position of the device under test has been adjusted, to fit the test socket, where the device holder includes: an inner unit to mount the device under test; an outer unit to retain the inner unit to be movable; and a release button to release a lock of movement of the inner unit, in response to being pressed from a side to which the device under test is mounted, and the actuator sets the inner unit to be movable by pressing the release button and adjusts a position of the inner unit.

According to a second aspect related to the innovations herein, provided is a device holder that mounts the device under test and fits the test socket by being conveyed by the conveyer, in the handler apparatus according to the first aspect.

According to a third aspect related to the innovations herein, provided is a test apparatus A test apparatus that includes the handler apparatus according to the first aspect for conveying the device under test to the test socket, the test apparatus testing the device under test and further including: a test head to be electrically connected to the device under test via the test socket; and a test module testing the device under test via the test head.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
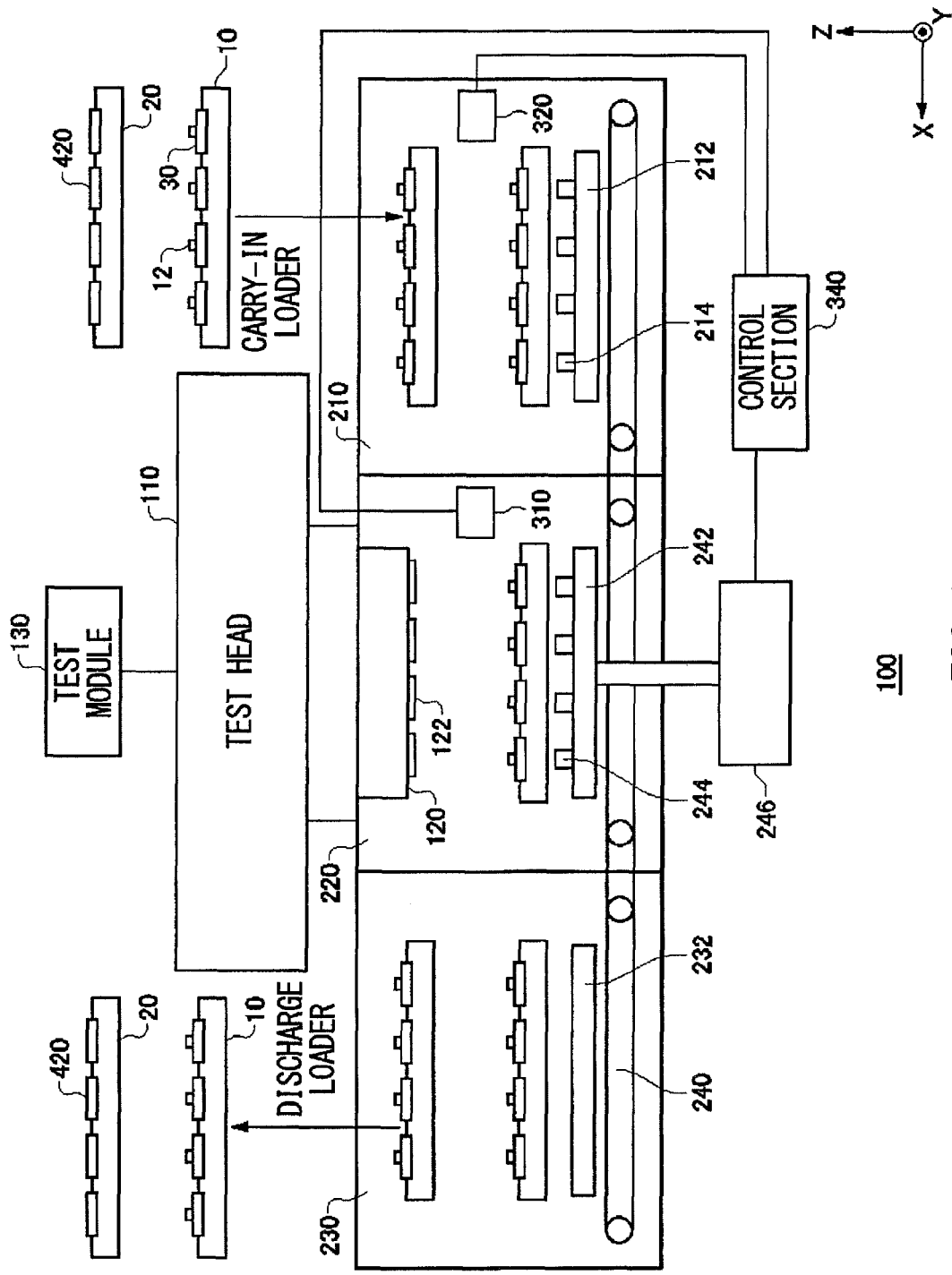
FIG. 1 shows an exemplary configuration of a handler apparatus 100 according to the present embodiment, together with a test head 110, a test module 130, a device tray 10, and a tray for adjustment 20.

FIG. 1 shows an exemplary configuration of a handler apparatus 100 according to the present embodiment, together with a test head 110, a test module 130, a device tray 10, and a tray for adjustment 20. Here, the test head 110 and the test module 130 are a part of the test apparatus testing the device under test 12. The handler apparatus 100 is connected to the test head 110. The handler apparatus 100 conveys a plurality of devices under test 12 to test sockets 122 provided in the test head 110, and electrically connects the devices under test 12 to the test sockets 122.

The test head 110 includes a socket board 120. The socket board 120 includes a plurality of test sockets 122. The test head 110 is electrically connected to each of the plurality of devices under test 12 via the plurality of test sockets 122. The test head 110 electrically connects the plurality of devices under test 12 connected to the plurality of test sockets 122, to the test module 130.

The test module 130 tests the devices under test 12 via the test head 110. The test module 130 inputs a test signal based on a test pattern for testing the plurality of devices under test 12, to each of the plurality of devices under test 12. The test module 130 determines good or bad of the plurality of devices under test 12 based on an output signal outputted from each of the devices under test 12 in response to the test signal.

The test apparatus tests a plurality of devices under test 12, such as an analog circuit, a digital circuit, analog/digital hybrid circuit, a memory, and a system on chip (SOC). Each of the plurality of devices under test 12 includes an electrode such as BGA (ball grid array) or an LGA (land grid array).

Instead, the device under test 12 may include a terminal such as SOJ (small outline J-leaded), PLCC (plastic leaded chip carrier), QFP (quad flat package), or SOP (small outline package). A socket board 120 includes a test socket 122 electrically connectable to an electrode, a terminal, or the like included in a device under test 12 to be tested.

The handler apparatus 100 carries in the device tray 10 and the tray for adjustment 20 to inside. The handler apparatus 100 conveys the device under test 12 mounted to the device tray 10 carried in, by adjusting the position of the device under test 12, so as to connect the device under test 12 to the test socket 122. In addition, after the test apparatus has tested the device under test 12 carried in, the handler apparatus 100 discharges the device under test 12 to outside of the handler apparatus 100.

Here, the device tray 10 mounts thereon the device holder 30 retaining the device under test 12. In an example, the device tray 10 includes a plurality of device holders 30, so that one device under test 12 may be assigned one device holder 30. The handler apparatus 100 conveys the device under test 12 together with the device holder 30 to the test socket 122.

In an example, the device tray 10 and the device holder 30 are made of materials that would not cause any stress to the device under test 12 such as breaking, cracking, or deformation, even under temperature conditions adopted in high/low temperature tests executed by the test apparatus. In addition, the tray for adjustment 20 stores a socket fitting unit 420 or the like used in adjusting the position of the device under test 12. The device tray 10 and the tray for adjustment 20 are described later.

The handler apparatus 100 includes a heating section 210, a test section 220, a heat removing section 230, a conveyer 240, a test-socket image-capturing section 310, an actuator unit 320, and a control section 340.

The heating section 210 includes a carry-in loader. The carry-in loader loads the device tray 10 having mounted thereon the device holder 30, to inside the heating section 210. The heating section 210 controls the temperature of the device under test 12 to a predetermined test temperature, prior to the test in the test section 220. The handler apparatus 100 adjusts the position of the device under test 12 on each device holder 30, within the heating section 210. The heating section 210 may configure a chamber including an air-tight space in which the temperature, the atmosphere, or the like can be controlled. The heating section 210 includes a temperature control section 212.

The temperature control section 212 mounts thereon a device tray 10 carried in the heating section 210. The temperature control section 212 controls the temperature of a plurality of devices under test 12 retained by the mounted device tray 10. The temperature control section 212 may mount thereon the device tray 10, by moving in Z direction going from the surface of the device tray 10 opposite to the surface on which the devices under test 12 are mounted towards the device tray 10. In an example, the temperature control section 212 controls the temperature of the plurality of devices under test 12 to be substantially equal to those under the temperature conditions of the test executed by the test apparatus according to the test program. Here, the temperature control section 212 may include a plurality of temperature control units 214.

In this example, a plurality of temperature control units 214 are provided to correspond to the maximum possible number of the devices under test 12 mountable on the device tray 10. Each temperature control unit 214 individually heats or cools the corresponding device under test 12 together with the device holder 30 from the backside. The backside of the device under test 12 is the surface opposite to the electrode surface or the terminal surface of the device under test 12 to be connected to the test socket 122. The temperature control unit 214 may be a thermoelement such as a Peltier element, or may be a cooler or a heater for circulating a cooling medium or a heat medium.

When each temperature control unit 214 directly controls the temperature of each device under test 12 from the backside of the device under test 12, the heating section 210 can control the temperature of the plurality of devices under test 12 rapidly and at low consumption power, without requiring accurate control of the temperature of the entire chamber. Alternatively, the temperature control section 212 may control the temperature of each device under test 12, by controlling the temperature of the entire chamber of the heating section 210 to be substantially the same as the temperature condition of the test.

The test section 220 includes a space in which a plurality of devices under test 12 can be tested. The device tray 10 and the tray for adjustment 20 in the heating section 210 are carried in the test section 220. The test section 220 may configure a chamber including an air-tight space in which the temperature, the atmosphere, or the like are controlled. The test section 220 is connected to the test apparatus. The socket board 120 to be mounted to the test head 110 of the test apparatus is positioned in the chamber of the test section 220.

In the test section 220, the device tray 10 is conveyed to the socket board 120, and the plurality of devices under test 12 are electrically connected to the test sockets 122 respectively. Also in the test section 220, the tray for adjustment 20 is conveyed to the socket board 120, and the plurality of socket fitting units 420 fit the test sockets 122 respectively.

The heat removing section 230 includes a space into which the device tray 10 and the tray for adjustment 20 are carried in from the test section 220. The heat removing section 230 discharges the device tray 10 and the tray for adjustment 20 having been carried in, to outside of the heat removing section 230. The heat removing section 230 includes a discharge loader. The discharge loader unloads, to outside of the heat removing section 230, the device tray 10 retaining a plurality of devices under test 12 whose temperature has been controlled in the heat removing section 230. The heat removing section 230 may configure a chamber. The heat removing section 230 includes a temperature control section 232.

The temperature control section 232 controls the temperature of the device tray 10 in the heat removing section 230. The temperature control section 232 heats or cools the plurality of devices under test 12 having been carried in from the test section 220, from around the test temperature to the same level as the room temperatures, by controlling the temperature of the device tray 10. The temperature control section 232 may include a thermoelement such as a Peltier element, or may include a cooler or a heater for circulating a cooling medium or a heat medium.

The conveyer 240 conveys the device tray 10 from the heating section 210 to the test section 220. The conveyer 240 makes, fit the test socket 122, the device holder 30 retaining the device under test 12, in the test section 220. In addition, the conveyer 240 conveys the device tray 10 from the test section 220 to the heat removing section 230, after the device under test 12 has been tested. The conveyer 240 may receive the device tray 10 carried in from the carry-in loader included in the heating section 210. In addition, the conveyer 240 may transfer the device tray 10 to the discharge loader included in the heat removing section 230. The conveyer 240 includes a device mounting section 242 and a driving section 246.

The device mounting section 242 is provided in the test section 220. The device mounting section 242 mounts the device under test 12 retained by the device holder 30, to a corresponding test socket 122 of the socket board 120. The device mounting section 242 includes a plurality of pressing sections 244. The plurality of pressing sections 244 are provided to correspond to the plurality of devices under test 12. The pressing sections 244 mount the devices under test 12 to the test sockets 122 respectively, by pressing the surface of the device holder 30 which is opposite to the surface retaining the devices under test 12 towards the socket board 120.

The device mounting section 242 or the pressing sections 244 may include an absorption section for adsorbing the device holder 30 on the surface facing the device holder 30. In this case, the device mounting section 242 or the pressing sections 244 remove(s) the device holders 30 mounted to the test sockets 122 by adsorbing the devices under test 12 and moving them in a direction apart from the socket board 120.

In addition, the device mounting section 242 may control the temperature of the plurality of devices under test 12 on the device tray 10. In an example, the device mounting section 242 controls the temperature of the plurality of devices under test 12 so as to satisfy the temperature condition of the test executed by the test apparatus. The device mounting section 242 may control the temperature of each of the devices under test 12 in contact with the plurality of pressing sections 244. Here, each of the plurality of pressing sections 244 may control the respective temperatures individually, or alternatively, the pressing sections 244 may control the temperature of two or more pressing sections 244 collectively.

In this case, each of the pressing sections 244 individually heat or cool the surface opposite to the electrode surface or the terminal surface of the corresponding device under test 12. The pressing sections 244 may include a thermoelement such as a Peltier element, or may include a cooler or a heater for circulating a cooling medium or a heat medium. When the pressing sections 244 directly control the temperature of the devices under test 12 respectively, from the backside of the devices under test 12, the handler apparatus 100 can control the temperature of the plurality of devices under test 12 rapidly and at low consumption power, without requiring accurate control of the temperature of the entire chamber of the test section 220. Alternatively, the test section 220 may include a temperature control section for controlling the temperature of the entire chamber of the test section 220 to become substantially the same as the temperature condition of the test.

The driving section 246 drives the device mounting section 242. The driving section 246 controls the movement of the device mounting section 242, conveys the device tray 10 to the socket board 120, and electrically connects the plurality of devices under test 12 to the test sockets 122 respectively.

The test-socket image-capturing section 310 captures an image of a plurality of test sockets 122 included in the socket board 120. The test-socket image-capturing section 310 captures an image of an area including information indicating the position of the electrode in each test socket 122. The test-socket image-capturing section 310 in this example captures an image of a test socket 122 fitting the socket fitting unit 420. The test-socket image-capturing section 310 captures an image of an area including a mark or the like provided for the socket fitting unit 420 and an electrode in a test socket 122. Accordingly, the relative position of the electrode in the test socket 122 with respect to the mark or the like provided for the socket fitting unit 420 is obtained. The test-socket image-capturing section 310 may perform image capturing either on each test socket 122, or on a plurality of test sockets 122. The test-socket image-capturing section 310 may include an image-capturing camera and a moving section for moving the image-capturing camera, and capture the test socket 122 by moving the image-capturing camera to the vicinity of the test socket 122 to be image-captured.

Alternatively, the test-socket image-capturing section 310 may include an image-capturing camera and a mirror, and capture the test socket 122 via the mirror using the image-capturing camera. In this case, the test-socket image-capturing section 310 may capture the image of the test socket 122 to be image-captured, by moving the test socket 122 by means of the moving section for moving the mirror or the like, and by making the image of the test socket 122 to be incident on the image-capturing camera.

On the device tray 10 on which the plurality of devices under test 12 are mounted, the actuator unit 320 adjusts the positions of the devices under test 12 respectively to the positions corresponding to the electrodes of the test sockets 122 to be connected to the devices under test 12. The actuator unit 320 detects the position of the electrode for each device under test 12 in the heating section 210, and adjusts the position of the device under test 12 so as to enable connection of the electrode for the device under test 12 to the electrode for the corresponding test socket 122. In addition, the actuator unit 320 detects and adjusts the original point position, the driving distance, or the like of the actuator that it owns.

The control section 340 is connected to the test-socket image-capturing section 310 and the actuator unit 320, to control the position adjustment of the device under test 12. The control section 340 notifies the actuator unit 320 of the adjustment amount for the device under test 12 based on the image-capturing result of the test-socket image-capturing section 310, the detection result of the actuator unit 320, or the like, to enable adjustment of the position of the device under test 12. In addition, the control section 340 may control loading/unloading/conveyance of the device tray 10 and the tray for adjustment 20, driving of the device mounting section 242, or the like, by being connected to the driving section 246, the conveyer 240, the carry-in loader, the discharge loader, or the like.

In addition, the control section 340 may control the temperature of the plurality of devices under test 12, by being connected to the temperature control section 212, the device mounting section 242, and the temperature control section 232. In addition, the control section 340 may notify the test apparatus of completion of mounting of the plurality of devices under test 12, after mounting the plurality of devices under test 12 to the test sockets 122 respectively. In this case, the test apparatus may test the device under test 12 in response to the notification of mounting completion, and notify the control section 340 of completion or halting of the test. In response to the notification of completion of the test, the control section 340 mounts the device under test 12 on the device tray 10, and discharges the device tray 10.

Figure 2:
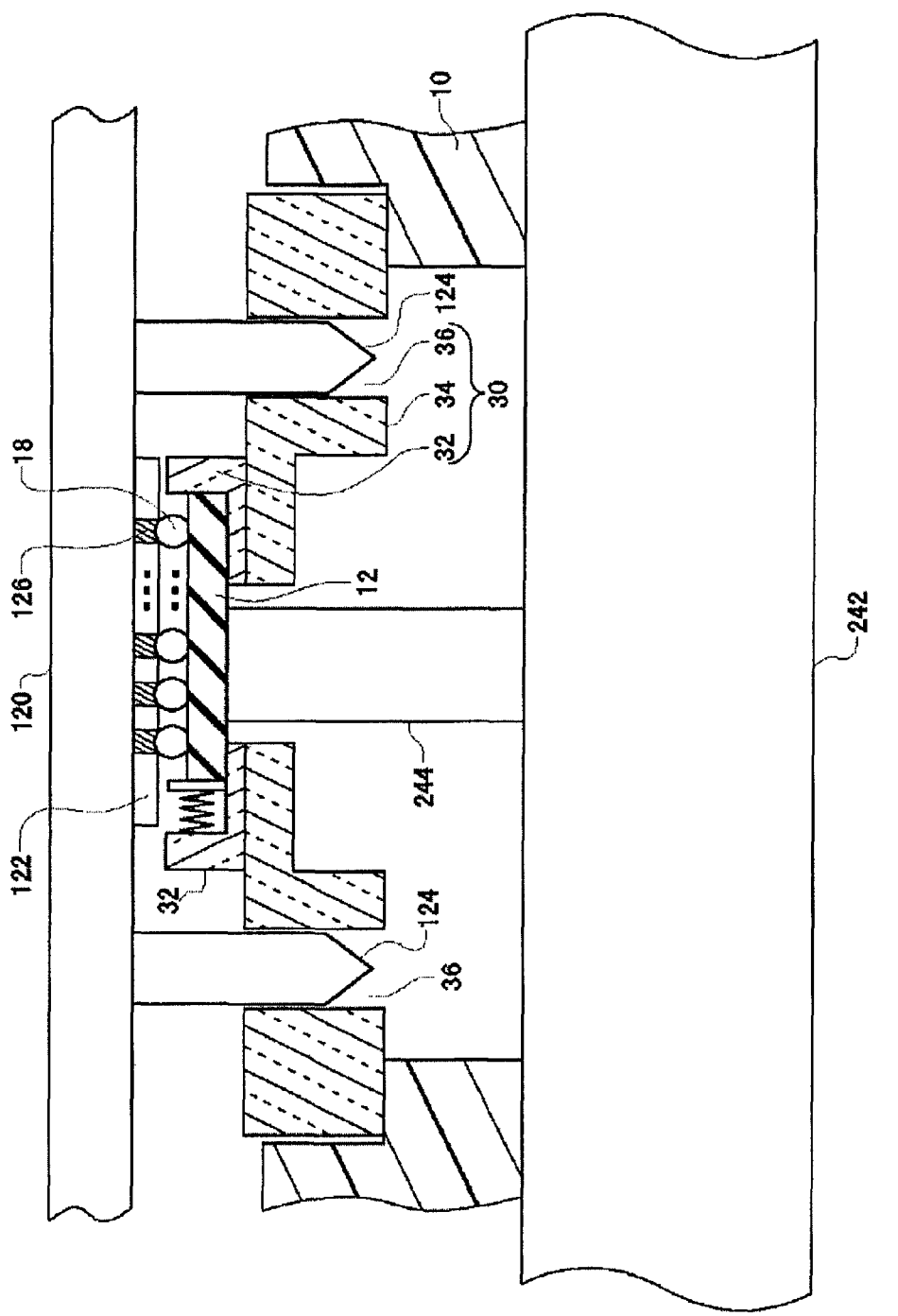
FIG. 2 shows an exemplary configuration in which the handler apparatus 100 according to the present embodiment has conveyed a device under test 12 to a test socket 122.

FIG. 2 shows an exemplary configuration in which the handler apparatus 100 according to the present embodiment has conveyed a device under test 12 to a test socket 122. FIG. 2 shows an example in which the device mounting section 242 has conveyed the device tray 10 mounted thereon to the vicinity of the socket board 120, and the pressing section 244 has mounted the device under test 12 to the corresponding test socket 122 by pressing the device under test 12 towards the socket board 120. In the present embodiment, an example in which the device under test 12 includes a plurality of BGA electrodes 18 is explained.

The test socket 122 is electrically connected to the device under test 12, to convey a test signal supplied from the test apparatus to the device under test 12. In addition, the test socket 122 conveys, to the test apparatus, a response signal outputted by the device under test 12 in accordance with the test signal. The socket board 120 includes a plurality of test sockets 122. The plurality of test sockets 122 may be aligned in both row and column direction on a surface of the socket board 120 opposite to the test head 110. The test socket 122 includes a socket pin 124 and a plurality of electrodes 126. The plurality of electrodes 126 of the test socket 122 are electrically connected to the plurality of electrodes 18 included in the device under test 12.

The socket pin 124 fits the device holder 30. There may be two or more socket pins 124 for a single test socket 122. The socket pins 124 are preferably assigned in the vicinity of four corners of the test socket 122, respectively.

The device holder 30 includes an inner unit 32, an outer unit 34, and a pin insertion section 36. The inner unit 32 mounts each one device under test 12. In an example, the inner unit 32 includes an elastic member for pressing the device under test 12 by elastic force or the like, to fix each device under test 12. The inner unit 32 maintains the fixed and mounted state of the device under test 12, while the device under test 12 is carried in the handler apparatus 100 until it is discharged.

The outer unit 34 retains the inner unit 32 to be movable. The outer unit 34 may include a lock mechanism for mechanically switching whether to set the inner unit 32 to be movable with respect to the outer unit 34, or to be fixed to the outer unit 34. The inner unit 32 and the outer unit 34 include a through hole to pass through the pressing section 244. In this case, the pressing section 244 pass through the inner unit 32 and the outer unit 34, to press the surface of the device under test 12 opposite to the surface on which the electrodes 18 are formed.

Alternatively, the surface of the outer unit 34 opposite to the surface to retain the inner unit 32 may be pressed by the pressing section 244 of the device mounting section 242. In this case, the outer unit 34 may be provided with a concave portion to which the pressing section 244 is pressed. Alternatively, the outer unit 34 may include a through hole to allow the pressing section 244 to pass through, and the pressing section 244 may press the surface of the inner unit 32 opposite to the surface to retain the device under test 12.

The pin insertion section 36 is formed to correspond to the socket pin 124, and fits the socket pin 124. That is, in response to the pressing section 244 pressing the device holder 30 to the test socket 122, the pin insertion section 36 fits the socket pin 124, to electrically connect the electrode 18 of the device under test 12 to the electrode 126 of the test socket 122.

Here, if the manufacturing accuracy or the like of the test apparatus, the handler apparatus 100 or the like becomes substantially the same level as the position accuracy or the like of the device under test 12 due to miniaturization of the size and pitch of the electrode 18 of the device under test 12, there may be cases in which the device under test 12 and the test socket 122 cannot be electrically connected even when the socket pin 124 fits the pin insertion section 36. In view of this, the handler apparatus 100 according to the present embodiment includes the test-socket image-capturing section 310, the actuator unit 320, and so on, and uses the tray for adjustment 20 or the like to adjust, in advance, the position of the device under test 12 to be mounted on the device holder 30, to cause the socket pin 124 to fit the pin insertion section 36, thereby electrically connecting the device under test 12 to the test socket 122.

Figure 3:
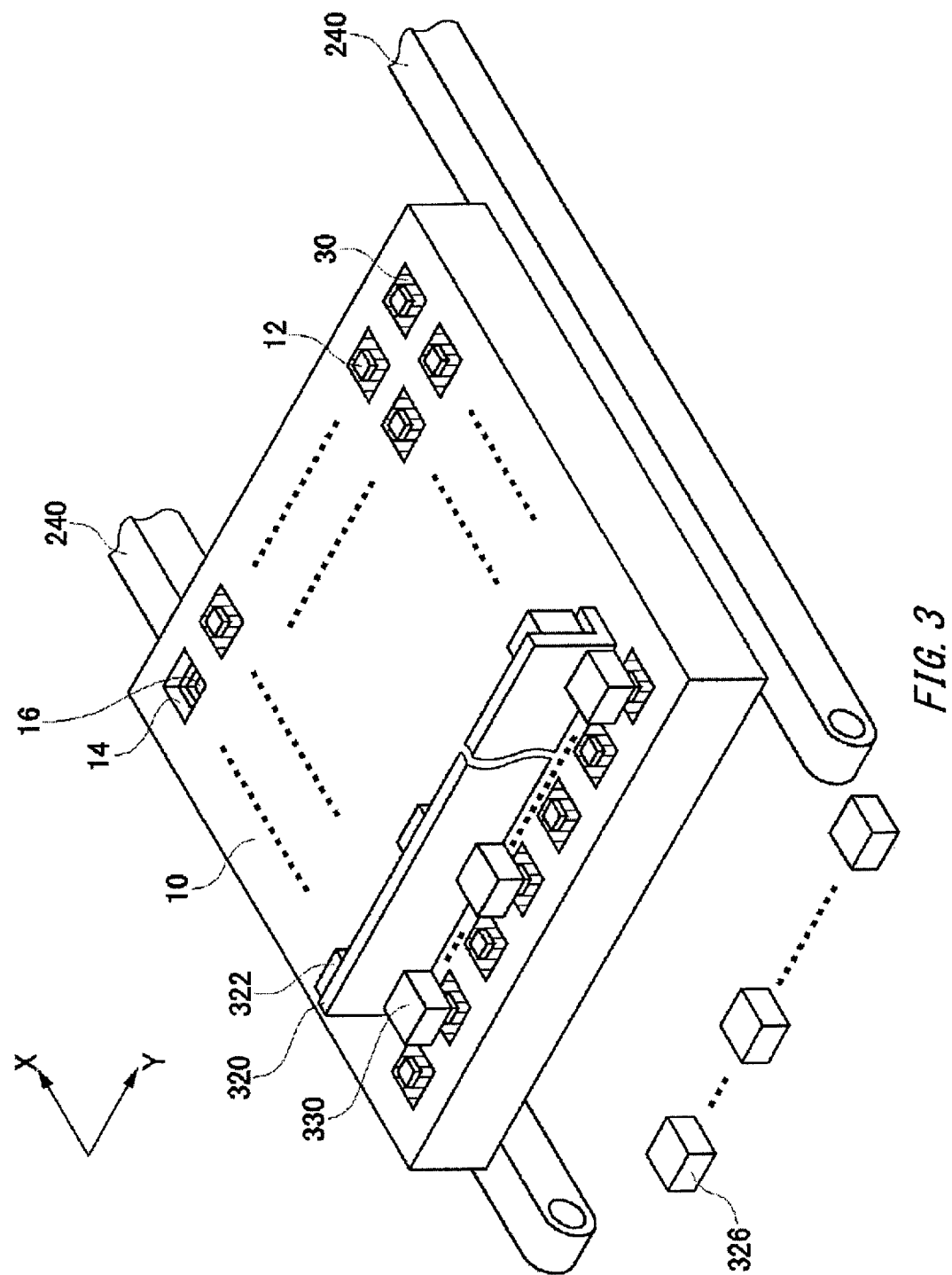
FIG. 3 shows an actuator unit 320 according to the present embodiment, together with a device tray 10.

FIG. 3 shows an actuator unit 320 according to the present embodiment, together with a device tray 10. FIG. 3 shows an example in which the device tray 10 is carried inside the heating section 210 by the carry-in loader, and mounted on the conveyer 240.

In an example, the device tray 10 mounts thereon a plurality of device holders 30 arranged in both row and column directions. The device tray 10 mounts thereon the plurality of device holders 30 to correspond to the arrangement of the test sockets 122 of the test apparatus.

In the present embodiment, an example in which device holders 30 aligned in 16 columns by 16 rows are mounted on the device tray 10 is described. In this case, the device tray 10 retains and conveys 256 devices under test 12 at maximum. Here, the row direction of the device tray 10 is referred to as X axis, and the column direction thereof is referred to as Y axis. In this case, the conveyer 240 moves the device tray 10 in X axis direction, and conveys it among the heating section 210, the test section 220, and the heat removing section 230.

The device tray 10 includes a storage 14 for storing the device holder 30 on one surface of the test section 220 facing the socket board 120. The storage 14 may be a concave formed for each of the plurality of device holders 30. In addition, each storage 14 includes a through hole 16 penetrating the device tray 10 from one surface to the other surface. Accordingly, the pressing section 244 included in the device mounting section 242 may pass through the through hole 16, to press the device holder 30 to the test socket 122.

The actuator unit 320 is provided on the device tray 10. The actuator unit 320 includes an actuator 330. The actuator 330 fits the device holder 30 prior to fitting of the device holder 30 retaining the device under test 12 to the test socket 122, to adjust the position of the device under test 12 on the device holder 30. The actuator 330 in this example adjusts the position of the device under test 12 on the device holder 30 by moving the inner unit 32 retaining the device under test 12 with respect to the outer unit 34. The actuator 330 adjusts the position of the device under test 12 on the device holder 30 based on the relative position of the device under test 12 with respect to the socket for adjustment 430 described later.

The actuator unit 320 may include a plurality of actuators 330. In this case, each actuator 330 adjusts the position of the corresponding device under test 12. For example, a plurality of actuators 330 are provided to correspond to the arrangement of the column direction of the devices under test 12, to respectively adjust the plurality of devices under test 12 arranged in the column direction. In this case, 16 actuators 330 may be provided in the column direction (Y direction in this example). The actuator unit 320 may adjust each column of 256 devices under test 12 at maximum, by moving 16 times in X direction by a distance corresponding to the arrangement of one column of the devices under test 12. Alternatively, the conveyer 240 may adjust each column of 256 devices under test 12 at maximum, by moving 16 times the device tray 10 in X direction by a distance corresponding to the arrangement of one column of the devices under test 12.

Alternatively, actuators 330 in number smaller than 16 may be provided in Y direction. In this case, the actuator unit 320 may move in Y direction in the heating section 210, to sequentially adjust the plurality of devices under test 12 aligned in the column direction. In an example, when eight actuators 330 are arranged in the column direction every other row, the eight actuators 330 respectively adjust the eight devices under test 12 in either even or odd lines of the plurality of devices under test 12 aligned in the column direction.

Accordingly, the actuator unit 320 can adjust the total of 16 devices under test 12 aligned in the column direction by moving in Y direction by a distance corresponding to the arrangement of one row of the devices under test 12. In addition, every time the adjustment for one column has finished, the actuator unit 320 moves in X direction by a distance corresponding to the arrangement of one column of the devices under test 12, thereby adjusting 256 devices under test 12 at maximum respectively. Alternatively, the conveyer 240 may adjust 256 devices under test 12 at maximum, by moving the device tray 10 in X direction by a distance corresponding to the arrangement of one column of the devices under test 12, every time the adjustment for one column has finished.

In this way, the actuator unit 320 may move in the column direction, to reduce the number of actuators 330 arranged in the column direction down to 1 at minimum. In the present embodiment, an example in which the actuator unit 320 has eight actuators 330 arranged in the column direction every one row.

Figure 4:
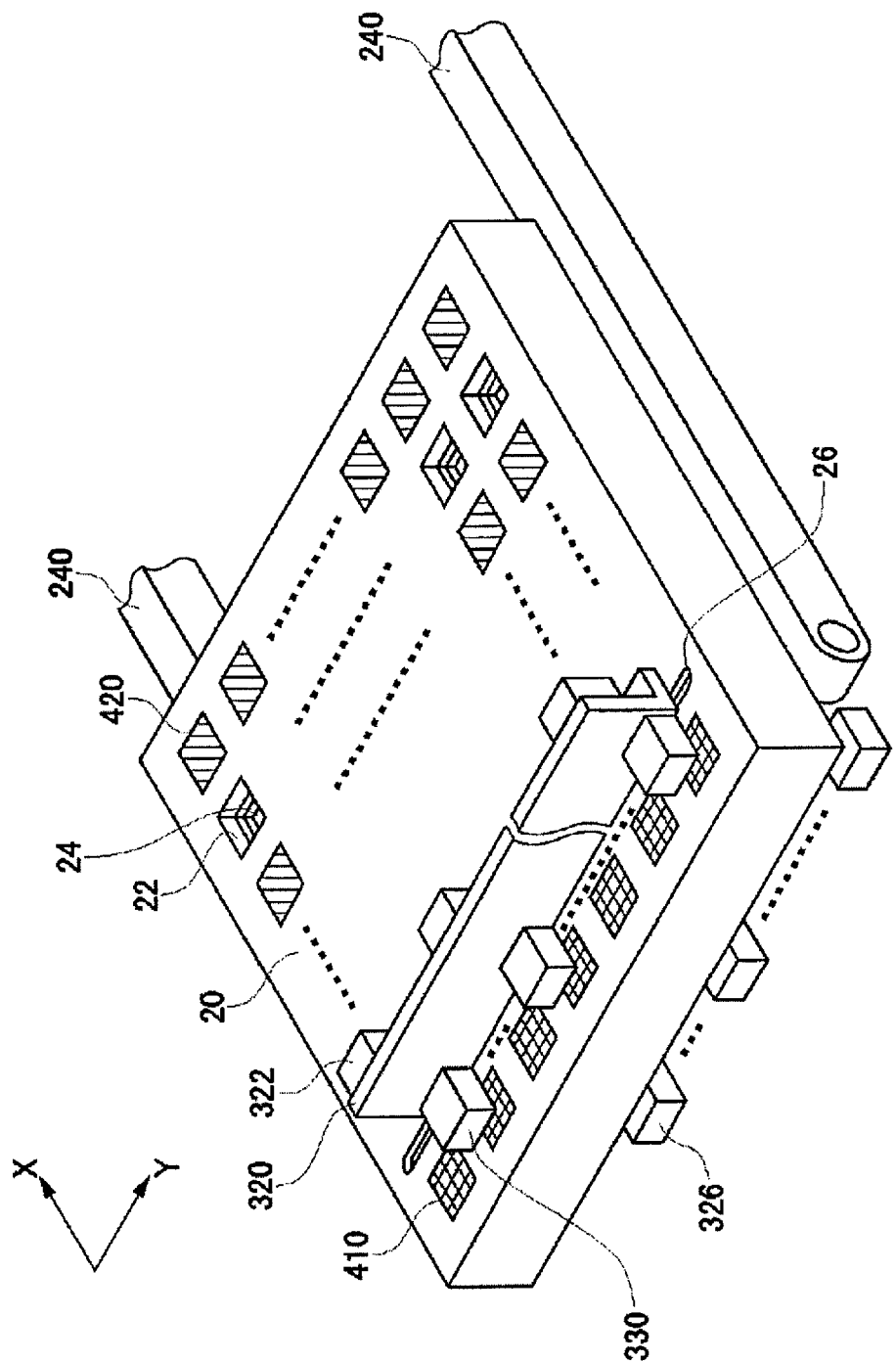
FIG. 4 shows an actuator unit 320 according to the present embodiment, together with a tray for adjustment 20.

FIG. 4 shows an actuator unit 320 according to the present embodiment, together with a tray for adjustment 20. FIG. 4 shows an example in which the tray for adjustment 20 is carried inside the heating section 210 by the carry-in loader, and mounted on the conveyer 240.

The tray for adjustment 20 is formed in substantially the same form as the device tray 10 mounting the device holder 30. The tray for adjustment 20 is formed to have an outer diameter which is the same as the outer diameter of the device tray 10, for example. The tray for adjustment 20 includes a storage 22 and a through slit 26.

For example, the storage 22 is formed in the same arrangement and the same form as the storage 14 of the device tray 10. In addition, each storage 22 includes a through hole 24 penetrating the tray for adjustment 20 from one surface to the other surface.

The tray for adjustment 20 mounts thereon a plurality of actuator fitting units 410 and a plurality of socket fitting units 420. The tray for adjustment 20 stores the actuator fitting units 410 and the socket fitting units 420 respectively in a predetermined arrangement in the storage 22.

For example, the plurality of storages 22 for storing the plurality of actuator fitting units 410 are arranged in the column. FIG. 4 shows an example in which the plurality of storages 22 for storing the plurality of actuator fitting units 410 are arranged in the first column that is opposite to the first side to be carried into the test section 220, in the tray for adjustment 20.

In addition, in an example, the plurality of storages 22 for storing the plurality of socket fitting units 420 are arranged in one column or a plurality of columns. That is, the plurality of socket fitting units 420 are arranged in a predetermined column other than the column of the plurality of storages 22 storing the plurality of actuator fitting units 410.

The through slit 26 penetrates the tray for adjustment 20 from the front surface to the rear surface, and is formed along the plurality of storages 22 for storing the plurality of actuator fitting units 410. FIG. 4 shows an example in which the through slit 26 is formed on the position of the second column adjacent to the aforementioned first column. The position of the through slit 26 in the tray for adjustment 20 corresponds to the position of the second column opposite to the first side to be carried into the test section 220 in the device tray 10. That is, the tray for adjustment 20 may have a form different from the form of the device tray 10, in that it has a through slit 26 instead of the storage 22 in the second column.

The actuator fitting unit 410 fits the actuator 330 included in the actuator unit 320. The actuator fitting unit 410 fits the actuator 330 by the relative position between the actuator unit 320 the tray for adjustment 20 becoming closer. The actuator fitting unit 410 has substantially the same form as at least the portion of the device holder 30 retaining the device under test 12.

The socket fitting unit 420 fits the test socket 122. The socket fitting unit 420 fits the test socket 122 as a result of the conveyer 240 conveying the socket fitting unit 420 to the test socket 122 of the test section 220.

Figure 5:
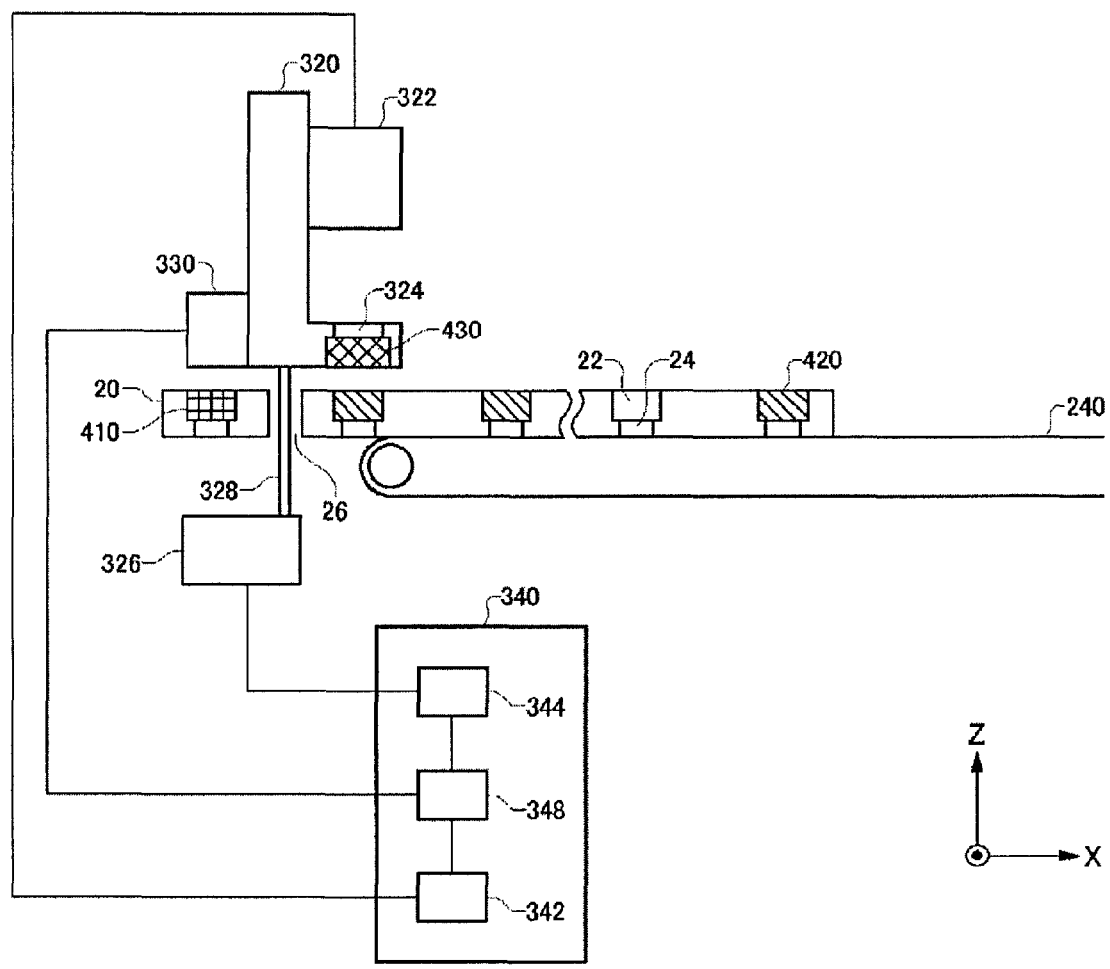
FIG. 5 is a sectional view in X direction of the actuator unit 320 and the tray for adjustment 20 shown in FIG. 4, together with a control section 340.

FIG. 5 is a sectional view in X direction of the actuator unit 320 and the tray for adjustment 20 shown in FIG. 4, together with a control section 340. In addition to the configuration shown in FIG. 4, the actuator unit 320 further includes a socket-for-adjustment image-capturing section 322, a through hole 324, an actuator image-capturing section 326, a link section 328, and a socket for adjustment 430. That is, an example in which the socket-for-adjustment image-capturing section 322, the actuator 330, and the socket for adjustment 430 are integrally formed in the actuator unit 320 is described.

The socket for adjustment 430 sequentially fits the device holder 30, the actuator fitting unit 410, and the socket fitting unit 420. By detecting the relative position of the socket fitting unit 420 and the device under test 12 on the device holder 30 with respect to the socket for adjustment 430 while fitting the socket for adjustment 430, positional difference of the device under test 12 and the socket fitting unit 420 can be detected. In addition, the socket fitting unit 420 can also fit the test socket 122. In addition, while fitting the socket fitting unit 420, the relative position of the test socket 122 with respect to the socket fitting unit 420 is detected. Accordingly, positional difference between the device under test 12 and the test socket 122 can be indirectly detected. Therefore, it becomes possible to detect positional difference of the device under test 12 and the test socket 122, prior to connection of the device under test 12 to the test socket 122, thereby enabling to adjust, in advance, the position of the device under test 12.

In an example, the socket for adjustment 430 is formed on one surface of the actuator unit 320 opposing the device tray 10 and the tray for adjustment 20. In an example, the socket for adjustment 430 fits the device holder 30 by the relative position between the actuator unit 320 and the device tray 10 becoming closer. In addition, the socket for adjustment 430 fits the actuator fitting unit 410 or the socket fitting unit 420 by the relative position between the actuator unit 320 and the tray for adjustment 20 becoming closer.

Here, by conveying the device tray 10 and the tray for adjustment 20 by the conveyer 240 in Z direction, the relative positions between the device tray 10 and the tray for adjustment 20 with respect to the actuator unit 320 may be respectively changed, to make them closer to each other. Instead, by movement of the actuator unit 320 in Z direction, the relative positions between the device tray 10 and the tray for adjustment 20 with respect to the actuator unit 320 may be respectively changed.

The socket-for-adjustment image-capturing section 322 captures an image of the socket for adjustment 430 and the device holder 30 fitting each other, from the side of the device tray 10 at which the device holder 30 is stored. In addition, the socket-for-adjustment image-capturing section 322 captures an image of the socket for adjustment 430 and the actuator fitting unit 410 fitting each other, from the side of the tray for adjustment 20 at which the actuator fitting unit 410 is stored. The socket-for-adjustment image-capturing section 322 may capture an image of a set of a socket for adjustment 430 and a device holder 30 and an image of a set of a socket for adjustment 430 and an actuator fitting unit 410, respectively. Alternatively, the socket-for-adjustment image-capturing section 322 may capture respective images of a plurality of sets of a socket for adjustment 430 and a device holder 30 and the like.

A through hole 324 may penetrate the actuator unit 320 from one surface of the actuator unit 320 facing the device tray 10 and the tray for adjustment 20 to the other surface opposite to the one surface. The through hole 324 is formed on at least a part of the area of the actuator unit 320 on which the socket for adjustment 430 is mounted. The socket-for-adjustment image-capturing section 322 captures, via the through hole 324, an image of the socket for adjustment 430 and the device holder 30 fitting each other and the socket for adjustment 430 and the actuator fitting unit 410 fitting each other, from the other surface of the actuator unit 320.

The actuator image-capturing section 326 captures an image of one actuator 330 or a plurality of actuators 330. The actuator image-capturing section 326 captures an image of the actuator 330 and the actuator fitting unit 410 from the side of the actuator fitting unit 410 opposite to the actuator 330, in the state in which the actuator 330 fits the actuator fitting unit 410. That is, the actuator image-capturing section 326 is provided for a surface of the tray for adjustment 20 opposite to the surface facing the actuator unit 320, and captures an image of the actuator 330 and the actuator fitting unit 410 fit each other, via the through hole 24 of the tray for adjustment 20.

For example, the actuator image-capturing sections 326 are provided along a column corresponding to the actuator 330 in the vicinity of the edge of the conveyer 240 opposite to the test section 220 in the heating section 210. Alternatively, the actuator image-capturing section 326 may be provided along a column at the side opposite to the side of the tray for adjustment 20 in which the actuator units 320 are arranged.

In the present embodiment, eight actuators 330 are arranged in the column direction every other row, and therefore eight actuator image-capturing sections 326 may also be arranged in the column direction every other row corresponding to the actuators 330. When the actuator image-capturing section 326 captures an image of the actuator 330, the conveyer 240 conveys the tray for adjustment 20 to a predetermined position near the edge of the conveyer 240. FIG. 4 and FIG. 5 show an example in which the conveyer 240 conveys the tray for adjustment 20 to the predetermined position.

The link section 328 links the actuator image-capturing section 326 to the actuator unit 320 in which the socket-for-adjustment image-capturing section 322 is provided through the through slit 26. When the actuator image-capturing section 326 captures an image of the actuator 330, the link section 328 links the socket-for-adjustment image-capturing section 322 and the actuator image-capturing section 326.

Accordingly, when the actuator image-capturing section 326 captures the image of a plurality of actuators 330 arranged in the column direction by moving in the column direction, the actuator image-capturing section 326 can move together with the actuator unit 320. Here, when the actuator image-capturing section 326 has a mechanism moving separately and independently from the actuator 330, no link section 328 is required. In addition, while the actuator image-capturing section 326 does not capture an image of the actuator 330, the link section 328 is stored in a position not in contact with any of the conveyer 240 or the tray for adjustment 20.

The control section 340 includes a socket-for-adjustment position detecting section 342, an actuator position detecting section 344, and an actuator adjusting section 348.

While the actuator fitting unit 410 fits the socket for adjustment 430, the socket-for-adjustment position detecting section 342 detects the relative position between the socket for adjustment 430 and the actuator 330. In addition, while the socket for adjustment 430 fits the socket fitting unit 420, the socket-for-adjustment position detecting section 342 detects the relative position between the socket for adjustment 430 and the socket fitting unit 420. In addition, while the socket for adjustment 430 fits the device holder 30, the socket-for-adjustment position detecting section 342 detects the relative position between the socket for adjustment 430 and the reference position of the device holder 30.

The socket-for-adjustment position detecting section 342 is connected to the socket-for-adjustment image-capturing section 322, and based on the image-capturing result of the socket-for-adjustment image-capturing section 322, detects the relative position. The socket-for-adjustment position detecting section 342 supplies the detected relative position to the actuator adjusting section 348.

The actuator position detecting section 344 is connected to the actuator image-capturing section 326, and based on the image-capturing result of the actuator 330 by the actuator image-capturing section 326, detects the distance and direction in which the actuator 330 moves. In addition, the actuator position detecting section 344 detects the relative position between the actuator 330 and the actuator fitting unit 410, based on the image-capturing result of the actuator 330 and the actuator fitting unit 410 fitting each other. The actuator position detecting section 344 supplies the detected relative position to the actuator adjusting section 348.

The actuator adjusting section 348 is connected to the actuator 330, and makes the actuator 330 fit the actuator fitting unit 410, and adjusts the amount of driving of the actuator 330. The actuator adjusting section 348 drives the actuator 330 while fitting the actuator fitting unit 410 for example, and adjusts the amount of driving based on the distance and direction in which the actuator 330 has actually moved.

In addition, the actuator adjusting section 348 adjusts the position of the device under test 12 by driving the actuator 330. The actuator adjusting section 348 calculates the position to which the device under test 12 should be adjusted, and moves the device under test 12 to the position by driving the actuator 330. The actuator adjusting section 348 adjusts the position of the device under test 12, based on the detection results supplied by the socket-for-adjustment position detecting section 342 and the actuator position detecting section 344.

Figure 6:
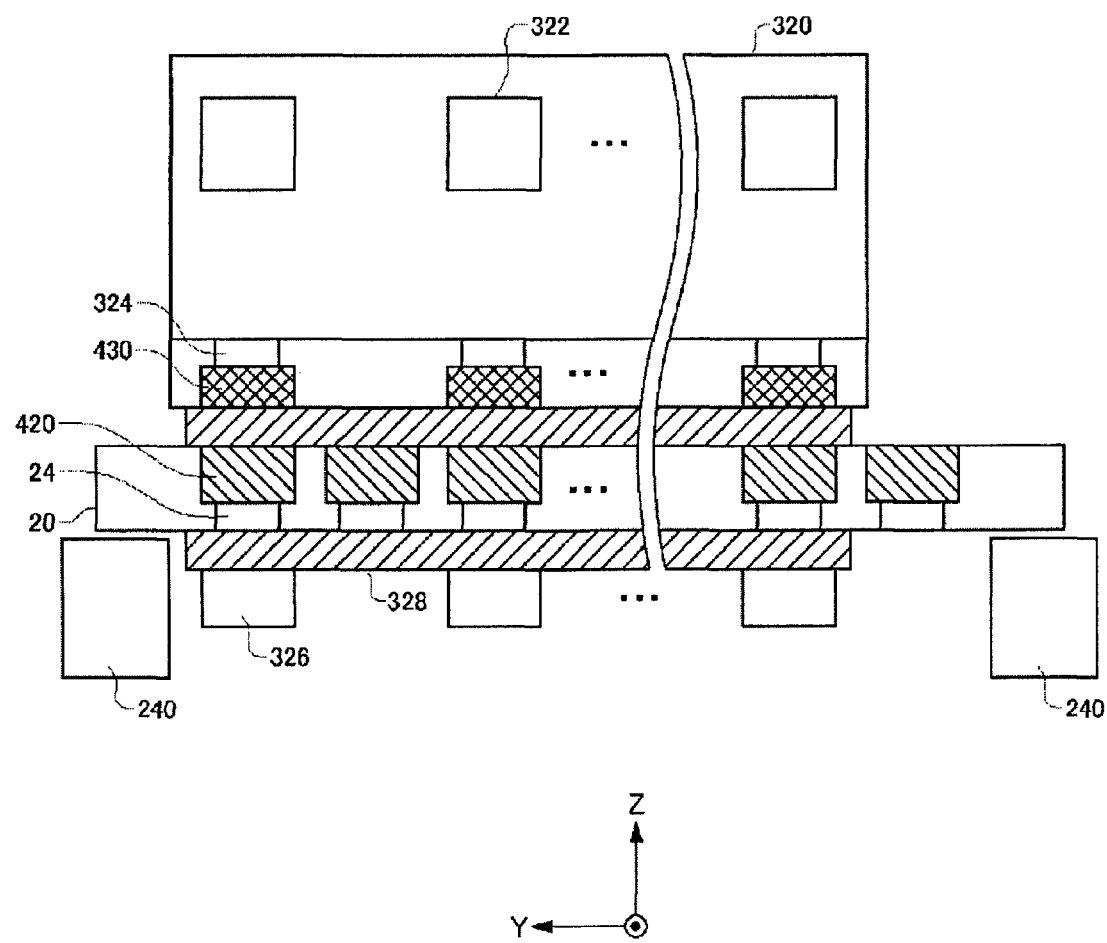
FIG. 6 is a sectional view in Y direction of the actuator unit 320 and the tray for adjustment 20 shown in FIG. 4.

FIG. 6 is a sectional view in Y direction of the actuator unit 320 and the tray for adjustment 20 shown in FIG. 4. The socket-for-adjustment image-capturing section 322 and the socket for adjustment 430 are provided in the actuator unit 320 in correspondence with the socket fitting unit 420. A plurality of socket-for-adjustment image-capturing sections 322 and sockets for adjustment 430 may be provided corresponding in arrangement of the socket fitting units 420 in the column direction. For example, 16 sets of socket-for-adjustment image-capturing sections 322 and sockets for adjustment 430 are provided in the column direction.

Alternatively, in the actuator unit 320, less than 16 sets of socket-for-adjustment image-capturing sections 322 and sockets for adjustment 430 may be provided in the column direction. In this case, the sockets for adjustment 430 move in Y direction in the heating section 210 just as the actuators 330, and the image thereof is captured by respectively fitting the plurality of socket fitting units 420 aligned in the column direction.

FIG. 6 shows an example in which the socket-for-adjustment image-capturing section 322 and the socket for adjustment 430 are provided in correspondence with the socket fitting units 420 aligned every other row in the column direction out of the plurality of socket fitting units 420, just as the actuators 330. In this case, eight sets of socket-for-adjustment image-capturing sections 322 and sockets for adjustment 430 are provided in the column direction every other row, and respectively fit eight socket fitting units 420 in either the odd row or the even row of the plurality of socket fitting units 420 arranged in the column direction.

In the tray for adjustment 20, the actuator fitting units 410 are arranged in the row direction in which the socket fitting units 420, and therefore can fit the sockets for adjustment 430 arranged in the column direction, just as the socket fitting units 420. In addition, the socket-for-adjustment image-capturing section 322 arranged in the column direction can capture an image of the sockets for adjustment 430 and the actuator fitting units 410 fitting each other.

In addition, in the tray for adjustment 20, when the actuator fitting units 410 are stored in the first column and the socket fitting units 420 in the third column, by making the actuator units 320 approach the tray for adjustment 20 to cause the actuators 330 fit the actuator fitting units 410 in the first column, it becomes possible to make the sockets for adjustment 430 fit the socket fitting units 420 in the third column. Accordingly, the actuator image-capturing section 326 can not only capture an image of the actuators 330, but also can the socket-for-adjustment image-capturing section 322 capture the sockets for adjustment 430.

The handler apparatus 100 according to the above-described embodiment, prior to carrying in the device tray 10, carries in the tray for adjustment 20, detects the relative position of each portion in the apparatus, and adjusts the position of the device under test 12 retained by the device tray 10. The operation of the handler apparatus 100 will be described with reference to FIG. 7.

Figure 7:
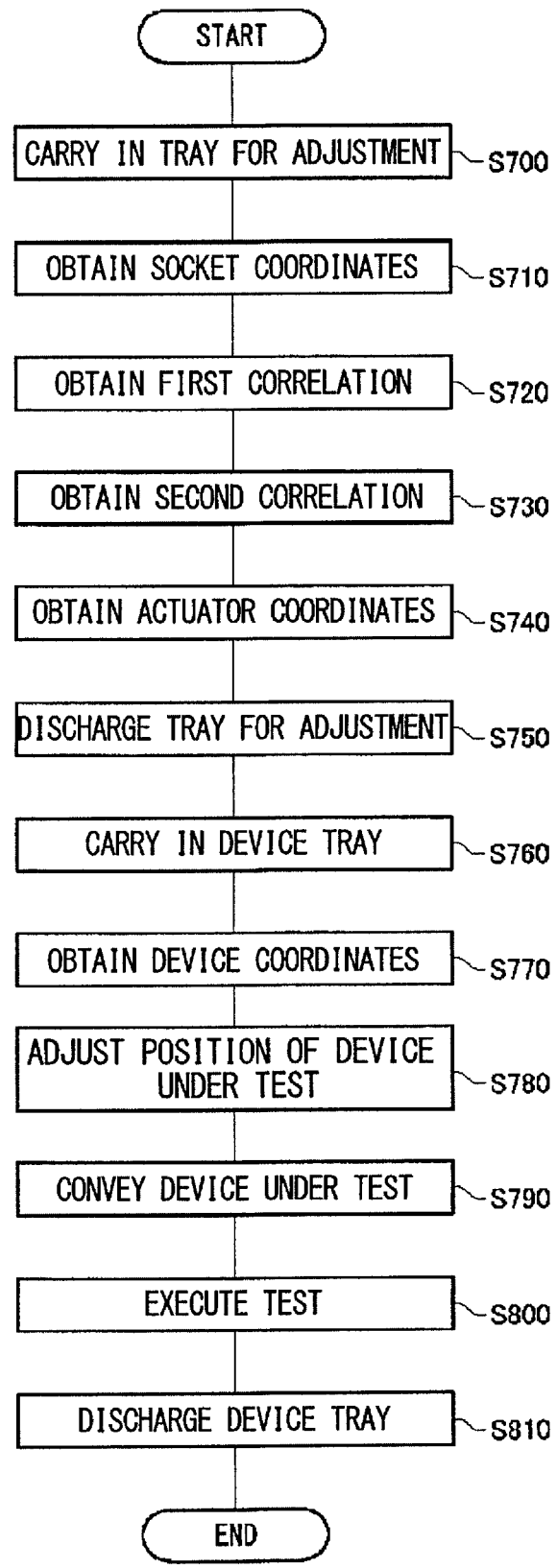
FIG. 7 shows an operational flow of the handler apparatus 100 according to the present embodiment.

FIG. 7 shows an operational flow of the handler apparatus 100 according to the present embodiment. FIG. 8 through FIG. 19 show an exemplary configuration of the handler apparatus 100 during conveyance of the device tray 10 and the tray for adjustment 20 by the handler apparatus 100.

First, the handler apparatus 100 carries in the tray for adjustment 20 (S700). The control section 340 causes the tray for adjustment 20 to be carried in the heating section 210 by the carry-in loader, and uses the conveyer 240 to convey it to the test socket 122 of the test section 220. Then, the control section 340 causes the socket fitting unit 420 stored in the tray for adjustment 20 by the device mounting section 242 to fit the test socket 122. That is, the test socket 122 fits the socket fitting unit 420, prior to the device holder 30 retaining the device under test 12 fitting the test socket 122.

Figure 8:
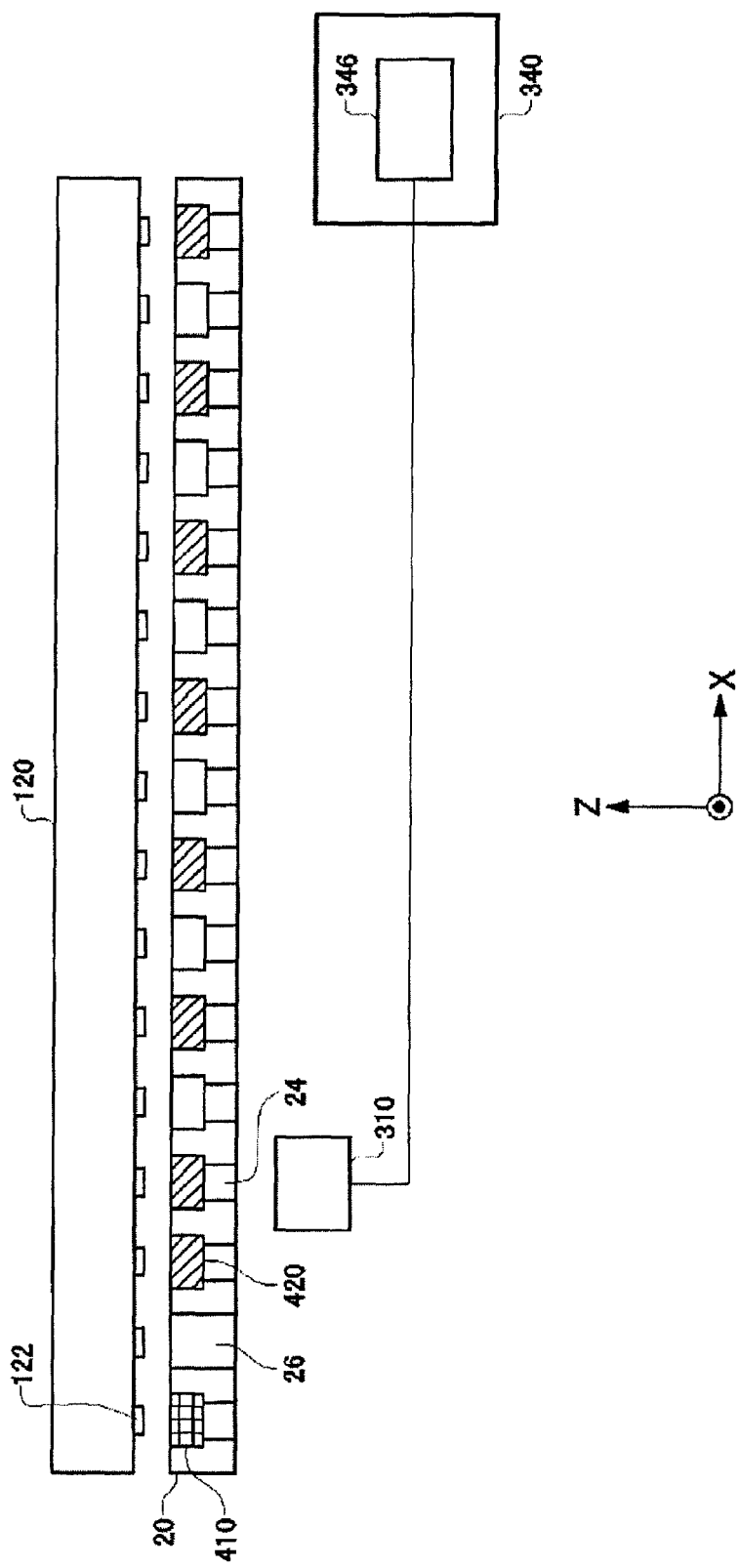
FIG. 8 shows a first exemplary configuration in which a socket fitting unit 420 according to the present embodiment has fitted the test socket 122.

FIG. 8 shows a first exemplary configuration in which a socket fitting unit 420 according to the present embodiment has fitted the test socket 122. In the present embodiment, an example in which the plurality of socket fitting units 420 are stored in the storages 22 in the third, fourth, sixth, eighth, tenth, twelfth, and sixteenth columns from the heating section 210 in the tray for adjustment 20 is explained. Here, the second column in the tray for adjustment 20 in FIG. 8 shows an example in which the through slit 26 is formed.

Next, the test-socket image-capturing section 310 captures an image of the test sockets 122 and socket fitting units 420 in the state in which the socket fitting units 420 fit the test socket 122, and obtains the socket coordinates representing the relative position of the socket fitting units 420 with respect to the test sockets 122 (S710). The test-socket image-capturing section 310 captures the image of the test sockets 122 and socket fitting units 420 fitting them in the third, fourth, sixth, eighth, tenth, twelfth, and sixteenth columns from the heating section 210 on the socket board 120.

Here, the control section 340 further includes a test-socket position detecting section 346 connected to the test-socket image-capturing section 310. The test-socket position detecting section 346 detects the relative position of the socket fitting unit 420 with respect to the test socket 122 in the state in which the test socket 122 fits the socket fitting unit 420.

Figure 9:
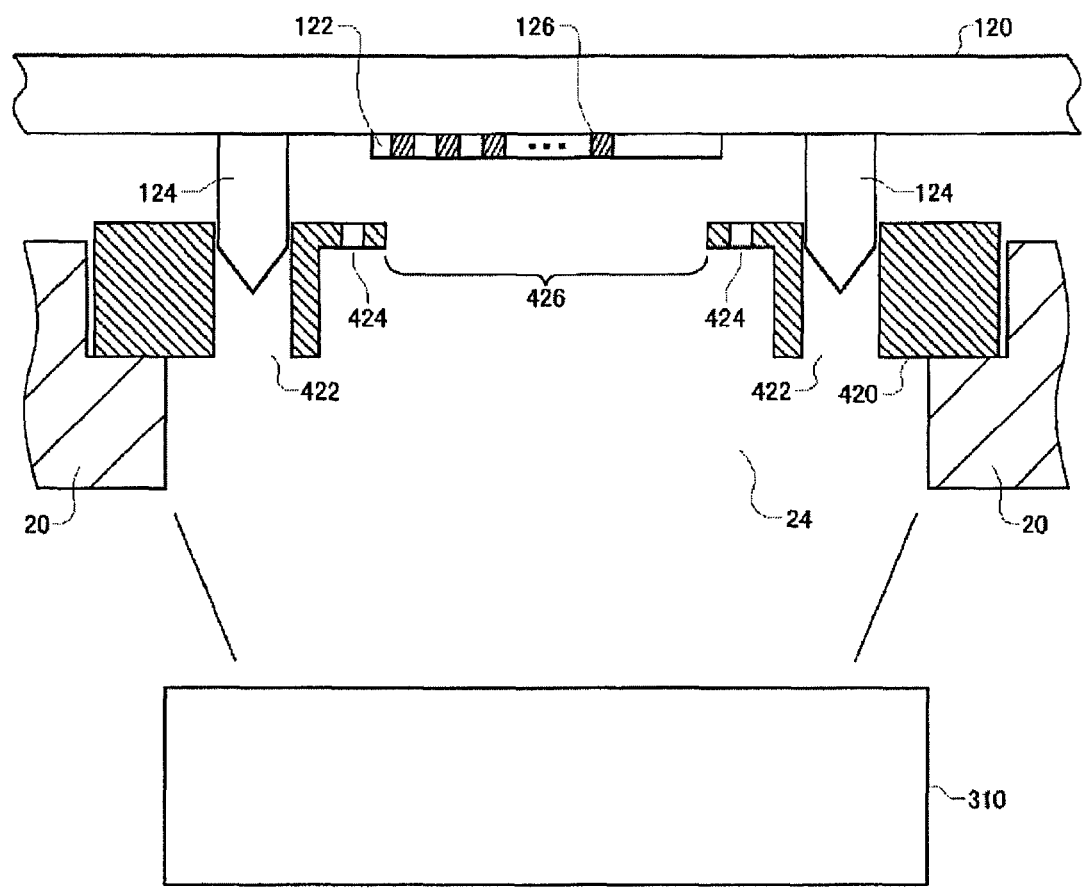
FIG. 9 shows an exemplary configuration in which a test-socket image-capturing section 310 according to the present embodiment captures an image of the test socket 122 and the socket fitting unit 420 fitting each other.

FIG. 9 shows an exemplary configuration in which a test-socket image-capturing section 310 according to the present embodiment captures an image of the test socket 122 and the socket fitting unit 420 fitting each other. Here, the socket fitting unit 420 includes a pin insertion section 422, a reference mark 424, and an opening 426. The pin insertion section 422 fits the socket pin 124. That is, the socket fitting unit 420 has a form that is the same as the form of at least the portion of the device holder 30 fitting the socket pin 124.

The reference mark 424 may be a convex, a concave, a material different in color or reflection rate, a through hole, or the like. FIG. 9 shows an example in which a through hole is formed. The opening 426 is a through hole that facilitates observation of an area including at least a part of the electrode 126 of the test socket 122 in the state in which it fits the test socket 122, from the side opposite to the surface that the test socket 122 fits.

The test-socket image-capturing section 310 captures an image of an area including at least a part of the reference mark of the socket fitting unit 420 and the test socket 122, in the state in which the socket fitting unit 420 fits the test socket 122, from the side of the socket fitting unit 420. The area whose image is captured by the test-socket image-capturing section 310 includes information indicating the position of the electrode 126 of the test socket 122. In this example, the information indicating the position of the electrode 126 is very the electrode 126 exposed in the opening 426 itself. In a different example, the information indicating the position of the electrode 126 may be a reference mark or the like provided on the test socket 122. The opening 426 may not be an area surrounded by the socket fitting unit 420. The test-socket position detecting section 346 detects the relative position between the electrode 126 of the test socket 122 and the reference mark of the socket fitting unit 420, based on the image-capturing result of the test-socket image-capturing section 310. That is, the test-socket position detecting section 346 detects the relative position of the electrode 126 of the test socket 122 with respect to the reference mark 424 of the socket fitting unit 420. By adjusting the position of the device under test 12 to correspond to the relative position of the electrode 126 of the test socket 122, it becomes possible to connect the test socket 122 with the device under test 12 with accuracy.

Next, the conveyer 240 conveys the tray for adjustment 20 so as to sequentially makes the socket fitting unit 420 fit two or more test sockets 122. For example, the conveyer 240 conveys the tray for adjustment 20 the distance worth of one column of the test sockets 122, towards the heating section 210 in the row direction (X direction). By doing so, the socket fitting units 420 stored in the storages 22 in the third, fourth, sixth, eighth, tenth, twelfth, and sixteenth columns can fit the test sockets 122 in the second, third, fifth, seventh, ninth, eleventh, thirteenth, and fifteenth columns from the heating section 210 of the socket board 120.

The test-socket image-capturing section 310 captures an image of the test socket 122 and the socket fitting unit 420 fitting each other from the side of the socket fitting unit 420. For this reason, the reference mark 424 is provided to be observable from the surface opposite to the surface that the test socket 122 fits, in the socket fitting unit 420.

The socket fitting unit 420 also fits the socket for adjustment 430. As detailed later, the image of the socket fitting unit 420 and the socket for adjustment 430 fitting each other will be captured from the side of the socket for adjustment 430. For this reason, the reference mark 424 of the socket fitting unit 420 is provided to be observable also from the surface fitting the socket for adjustment 430. That is, the reference mark 424 is a mark observable from both of the surface fitting the test socket 122 and the socket for adjustment 430 and the surface opposite to the surface fitting the test socket 122 and the socket for adjustment 430. In addition, the reference mark 424 of the socket fitting unit 420 is provided at a position not covered with the socket for adjustment 430 in the state in which the socket fitting unit 420 fits the socket for adjustment 430.

Figure 10:
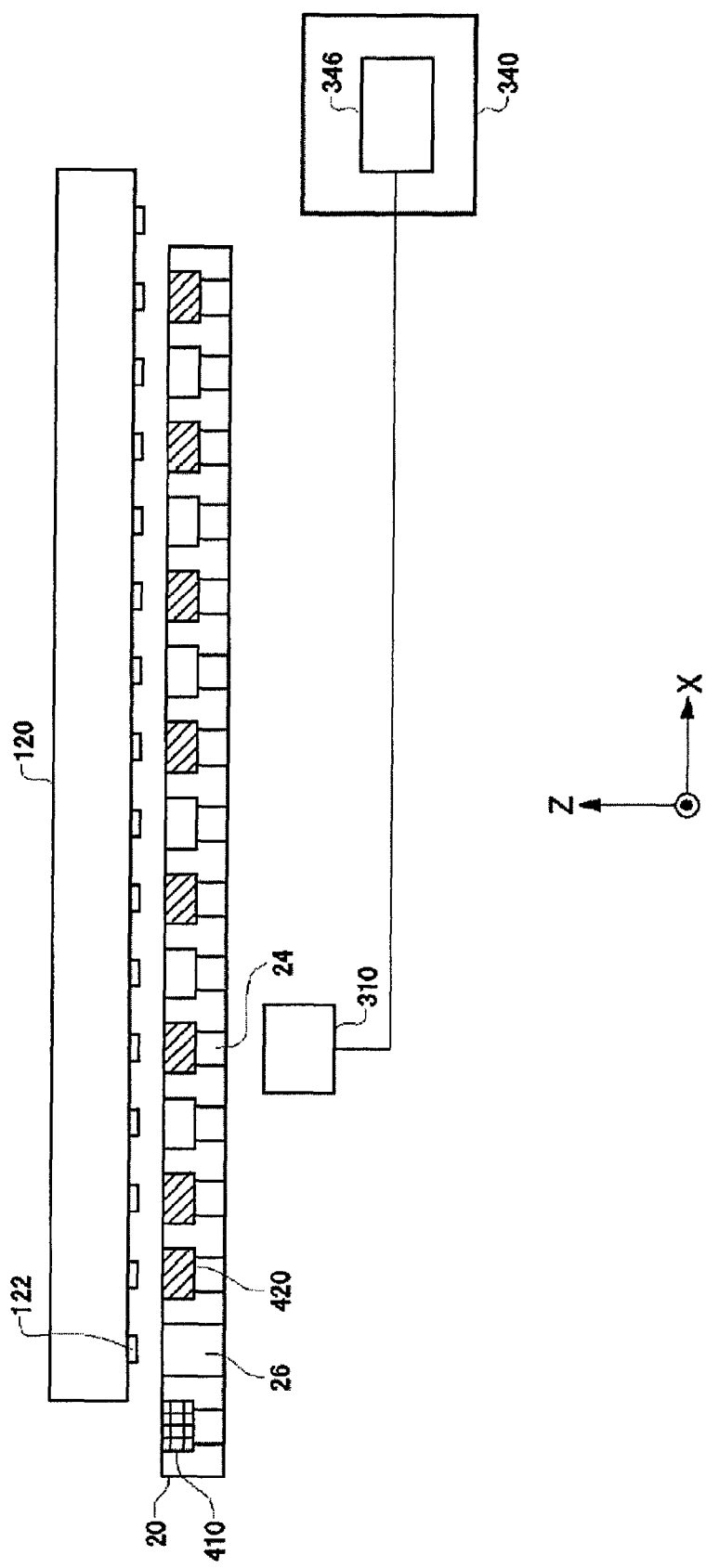
FIG. 10 shows a second exemplary configuration in which the socket fitting unit 420 according to the present embodiment has fitted the test socket 122.

FIG. 10 shows a second exemplary configuration in which the socket fitting unit 420 according to the present embodiment has fitted the test socket 122. In the state shown in FIG. 10, the test-socket image-capturing section 310 captures an image of the test sockets 122 in the second, fifth, seventh, ninth, eleventh, thirteenth, and fifteenth columns of the socket board 120 as well as the fitting socket fitting units 420. In the socket board 120, the first column, the second column, ... the sixteenth column are numbered starting from the end column in the negative direction on X axis. In addition, the test-socket position detecting section 346 detects the relative position between the electrode 126 of the test socket 122 in each targeted column and the reference mark on the socket fitting unit 420, respectively, based on the image-capturing result of the test-socket image-capturing section 310.

Likewise, the conveyer 240 conveys the tray for adjustment 20 one column towards the heating section 210 in the row direction. By doing so, the socket fitting unit 420 can fit the test sockets 122 in the first, second fourth, sixth, eighth, tenth, twelfth, and fourteenth columns of the socket board 120.

Figure 11:
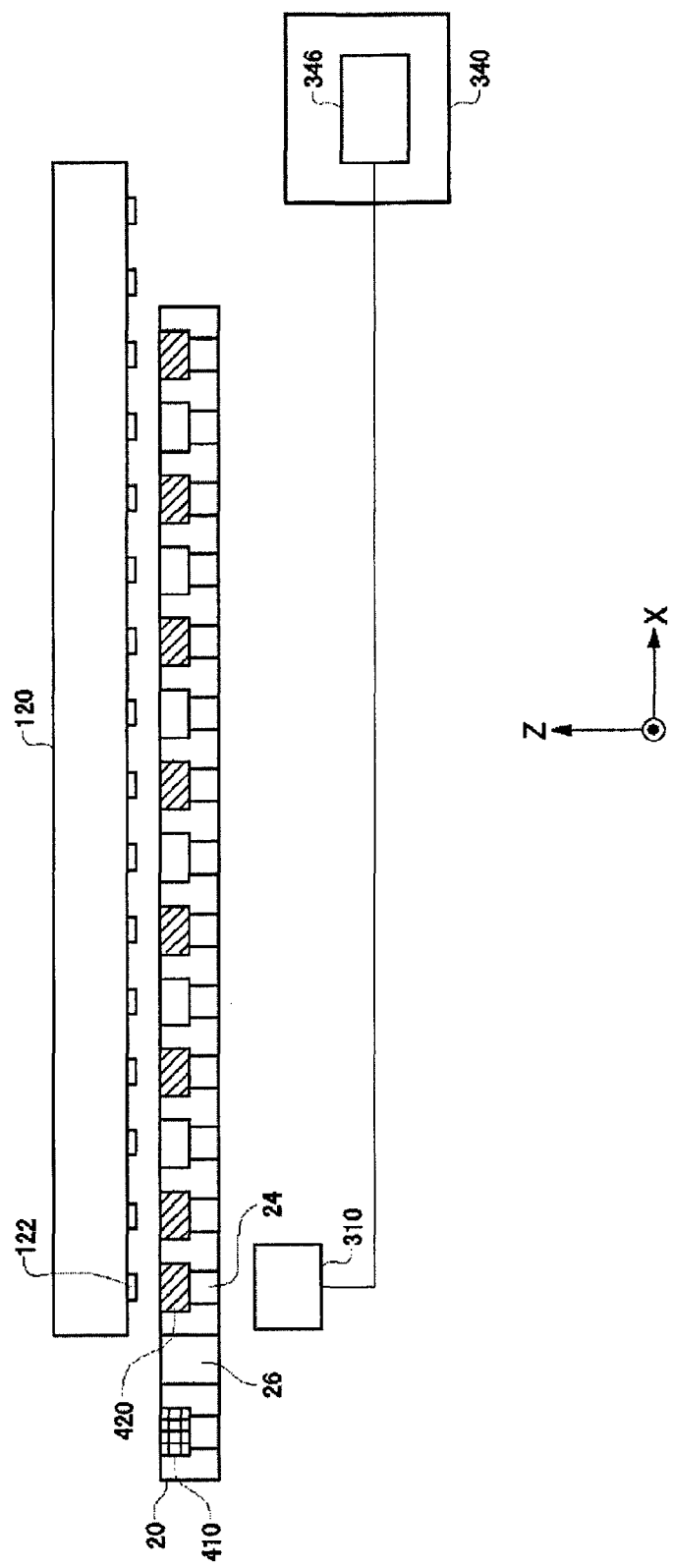
FIG. 11 shows a third exemplary configuration in which the socket fitting unit 420 according to the present embodiment has fitted the test socket 122.

FIG. 11 shows a third exemplary configuration in which the socket fitting unit 420 according to the present embodiment has fitted the test socket 122. Accordingly, the test-socket image-capturing section 310 captures an image of the test socket 122 in the first column of the socket board 120 as well as the fitting socket fitting unit 420. In addition, based on the image-capturing result of the test-socket image-capturing section 310, the test-socket position detecting section 346 detects the relative position between the electrodes 126 of the test sockets 122 and the reference marks of the socket fitting units 420 respectively, to obtain the socket coordinates of all the test sockets 122.

Next, the handler apparatus 100 makes the socket fitting unit 420 fit the socket for adjustment 430, to obtain the first correlation between the socket for adjustment 430 and the test socket 122 (S720). For example, when fitting the socket fitting unit 420, the first correlation includes information indicating the positional difference between the relative position of the socket for adjustment 430 with respect to the socket fitting unit 420 and the relative position of the test socket 122 with respect to the socket fitting unit 420. In this way, the socket fitting unit 420 is sequentially caused to fit the test socket 122 and the socket for adjustment 430. In addition, the conveyer 240 conveys the tray for adjustment 20, so as to sequentially cause the socket for adjustment 430 fit two or more socket fitting units 420. The conveyer 240 may convey the tray for adjustment 20 so that all the socket fitting units 420 stored in the tray for adjustment 20 fit the socket for adjustment 430.

Figure 12:
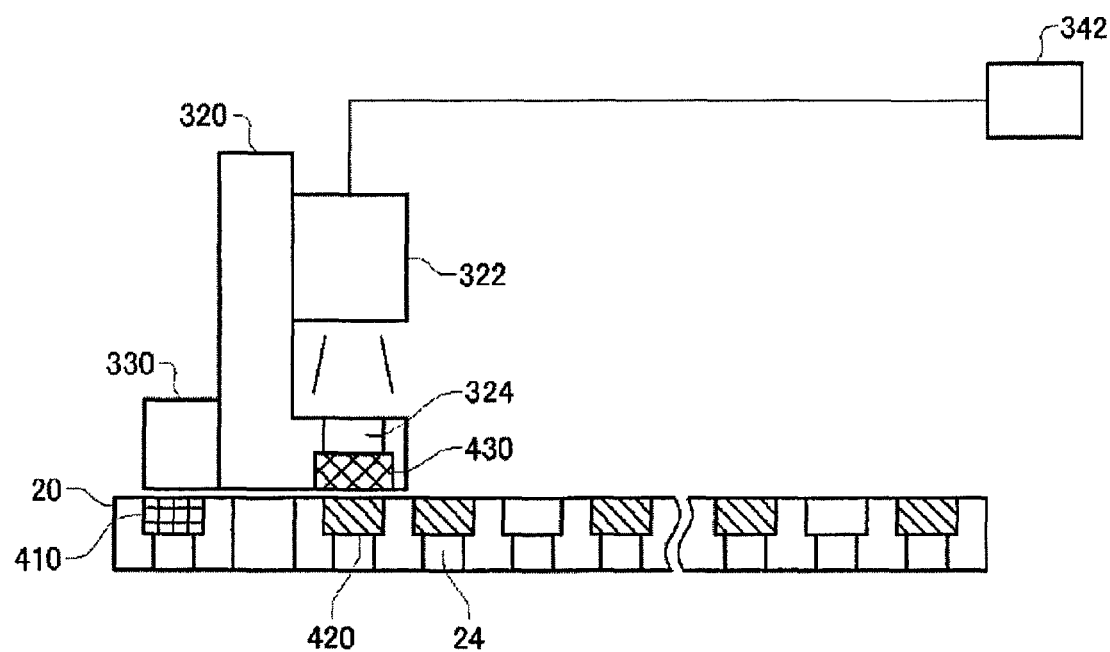
FIG. 12 shows an exemplary configuration in which the socket fitting unit 420 according to the present embodiment has fitted a socket for adjustment 430.

FIG. 12 shows an exemplary configuration in which the socket fitting unit 420 according to the present embodiment has fitted the socket for adjustment 430. FIG. 12 shows an example in which the socket fitting unit 420 in the third column in the tray for adjustment 20 has fitted the socket for adjustment 430. The control section 340 may control to sequentially move the conveyer 240 and/or the actuator unit 320 so that the socket fitting unit 420 in the other column in the tray for adjustment 20 fits the socket for adjustment 430.

Figure 13:
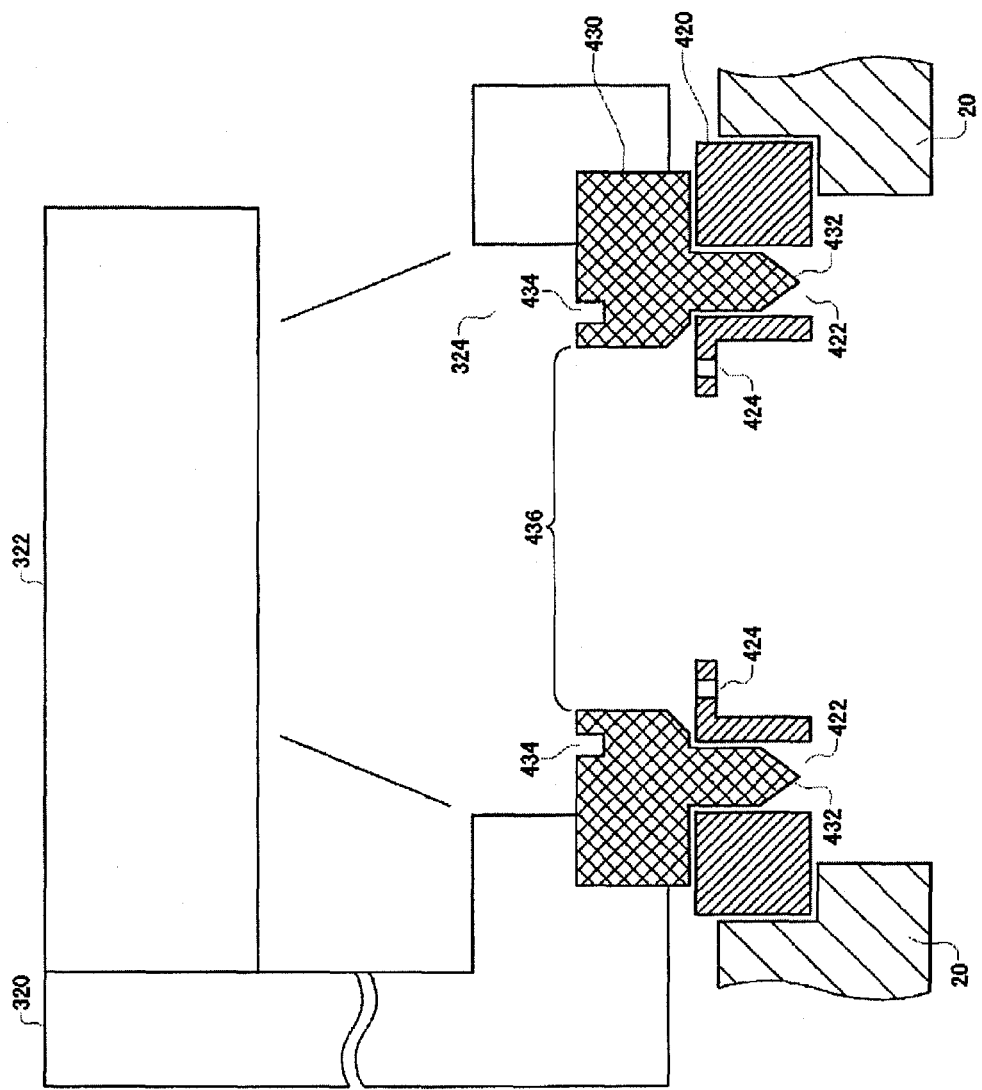
FIG. 13 shows an exemplary configuration in which a socket-for-adjustment image-capturing section 322 according to the present embodiment captures an image of the socket for adjustment 430 and the socket fitting unit 420 fitting each other.

The socket-for-adjustment image-capturing section 322 captures an image of the socket for adjustment 430 and the socket fitting unit 420, in the state in which the socket fitting unit 420 has fitted the socket for adjustment 430. FIG. 13 shows an exemplary configuration in which a socket-for-adjustment image-capturing section 322 according to the present embodiment captures an image of the socket for adjustment 430 and the socket fitting unit 420 fitting each other.

Here, the socket for adjustment 430 includes a socket pin 432, a reference mark 434, and an opening 436. The socket pin 432 fits the pin insertion section 422. That is, the socket for adjustment 430 has a form that is the same as the form of a portion of the test socket 122 at least fitting the device holder 30.

The reference mark 434 is a mark observable from the surface of the socket for adjustment 430, which is opposite to the surface that the device holder 30 and the socket fitting unit 420 fit. The reference mark 434 may be a convex, a concave, a material different in color or reflection rate, a through hole, or the like. FIG. 13 shows an example in which a convex is formed. The opening 436 is a through hole from which a part of the area of the socket fitting unit 420 is observable from the side opposite to the surface fitting the socket fitting unit 420. In this example, the part of the area includes a reference mark 424. In addition, the socket for adjustment 430 also fits the device holder 30. Through the opening 436, at least a part of the electrodes 18 of the device under test 12 is observable from the opposite surface, in the state fitted to the device holder 30.

The socket-for-adjustment image-capturing section 322 captures an image of the area including at least a part of the reference mark 424 of the socket fitting unit 420 and the socket for adjustment 430, via the through hole 324 and the opening 436, from the side of the socket for adjustment 430, in the state in which the socket fitting unit 420 has fitted the socket for adjustment 430. Here, the socket-for-adjustment image-capturing section 322 may capture an image including the reference mark 434 of the socket for adjustment 430.

The socket-for-adjustment position detecting section 342 detects the relative position of the socket fitting unit 420 with respect to the socket for adjustment 430 in the state in which the socket for adjustment 430 has fitted the socket fitting unit 420, based on the image-capturing result of the socket-for-adjustment image-capturing section 322. In an example, the socket-for-adjustment position detecting section 342 detects, as the relative position, the distance and direction between the reference marks 424 of the socket fitting units 420 and the reference marks 434 of the sockets for adjustment 430, respectively.

The control section 340 obtains the first correlation between the socket for adjustment 430 and the test socket 122, based on the detected relative position of the socket for adjustment 430 with respect to the socket fitting unit 420 and the relative position of the test socket 122 with respect to the socket fitting unit 420. For example, the socket-for-adjustment position detecting section 342 supplies the detected relative position to the test-socket position detecting section 346. The test-socket position detecting section 346 detects the positional difference between the relative position between the test socket 122 and the socket fitting unit 420 and the relative position between the socket fitting unit 420 and the socket for adjustment 430, as the amount of positional difference between the test socket 122 and the socket for adjustment 430, and sets it as the first correlation. The test-socket position detecting section 346 may supply the detected first correlation to the socket-for-adjustment position detecting section 342.

Next, the handler apparatus 100 makes the actuator fitting unit 410 fit the socket for adjustment 430, and obtains a second correlation between the test socket 122 and the actuator fitting unit 410 (S730). Here, the handler apparatus 100 obtains the first correlation between the socket for adjustment 430 and the test socket 122, and therefore, by detecting the relative position between the socket for adjustment 430 and the actuator fitting unit 410, the handler apparatus 100 can obtain the correlation between the actuator fitting unit 410 and the test socket 122.

Figure 14:
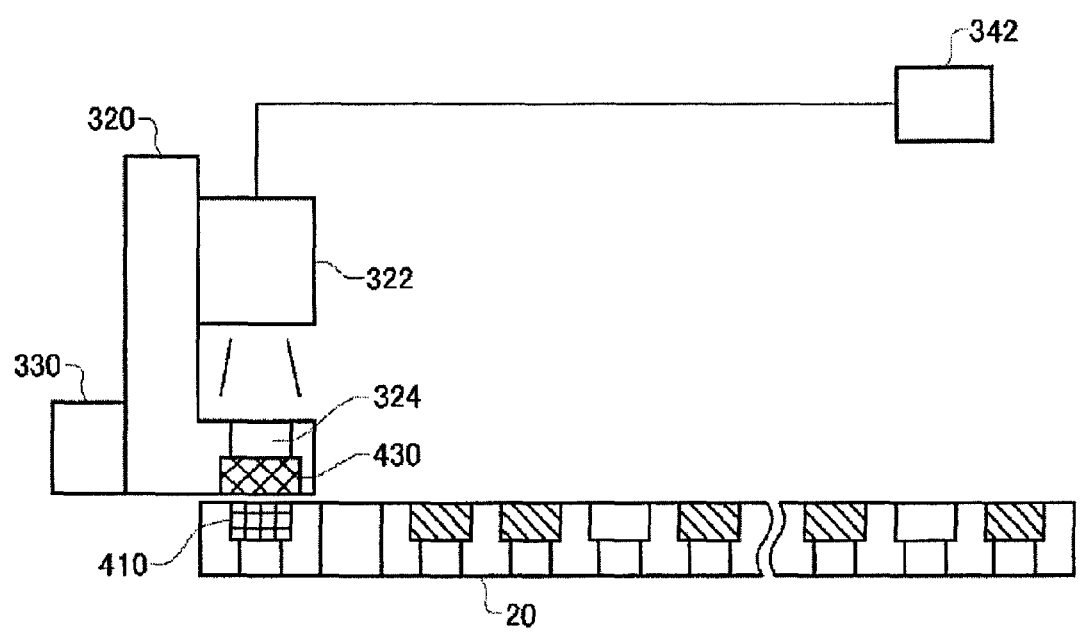
FIG. 14 shows an exemplary configuration in which the socket for adjustment 430 according to the present embodiment has fitted the actuator fitting unit 410.
Figure 15:
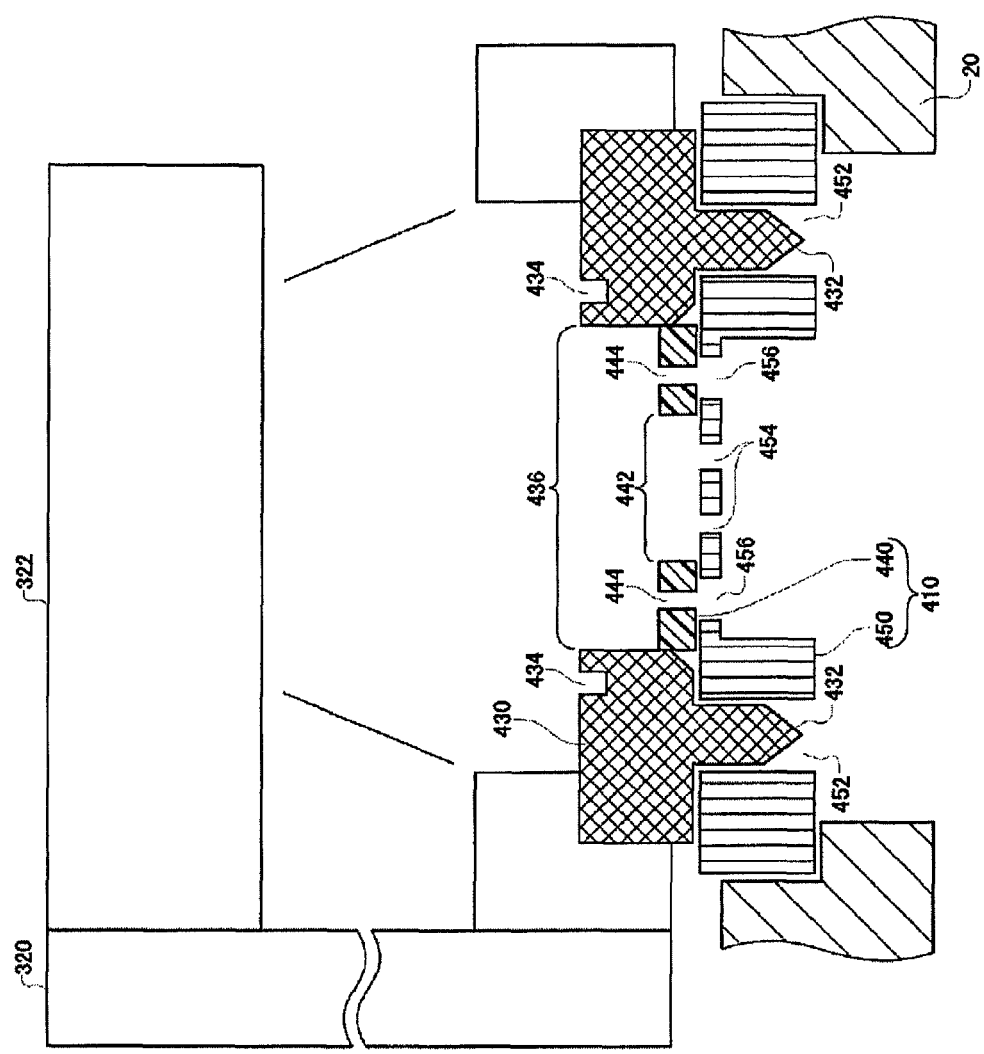
FIG. 15 shows an exemplary configuration in which a socket-for-adjustment image-capturing section 322 according to the present embodiment captures an image of the socket for adjustment 430 and the actuator fitting unit 410 fitting each other.

FIG. 14 shows an exemplary configuration in which the socket for adjustment 430 according to the present embodiment has fitting the actuator fitting unit 410. The socket-for-adjustment image-capturing section 322 captures an image of the socket for adjustment 430 and the actuator fitting unit 410 from the side of the socket for adjustment 430, in the state in which the socket for adjustment 430 has fitted the actuator fitting unit 410. Here, the socket-for-adjustment image-capturing section 322 may sequentially capture an image of the plurality of the actuator fitting units 410 fitted the socket for adjustment 430 from the front surface of the tray for adjustment 20. FIG. 15 shows an exemplary configuration in which a socket-for-adjustment image-capturing section 322 according to the present embodiment captures an image of the socket for adjustment 430 and the actuator fitting unit 410 fitting each other.

Here, the actuator fitting unit 410 includes an inner unit 440 and an outer unit 450. The inner unit 440 is formed to have an outer shape that is substantially the same as the outer shape of the inner unit 32 of the device holder 30. That is, by obtaining the second correlation, the inner unit 440 matches in shape the inner unit 32 of the device holder 30, to the extent that the correlation between the inner unit 32 of the device holder 30 and the test socket 122 can be obtained.

The inner unit 440 includes an opening 442 and a reference mark 444. The opening 442 is a through hole through which at least a part of the area of the outer unit 450 retaining the inner unit 440 is observable from the surface opposite to the surface retaining the inner unit 440. The reference mark 444 is a mark observable at both of the surface fitting the socket for adjustment 430 and the opposite surface thereto. The reference mark 424 may be a convex, a concave, a material different in color or reflection rate, a through hole, or the like. FIG. 15 shows an example in which a through hole is formed.

The outer unit 450 retains the inner unit 440 to be movable. The outer unit 450 may include a lock mechanism for mechanically switching whether to retain the inner unit 440 to be movable. The outer unit 450 includes a pin insertion section 452, a reference mark 454, and an opening 456. The pin insertion section 452 fits the socket pin 432. That is, the outer unit 450 has a shape that is the same as the shape of the portion of the device holder 30 at least fitting the socket pin 124.

The reference mark 454 is a mark observable from both of the surface fitting the socket for adjustment 430 and the actuator 330 and the opposite surface thereto. The reference mark 454 may be a convex, a concave, a material different in color or reflection rate, a through hole, or the like. FIG. 15 shows an example in which a through hole is formed. The reference mark 454 is formed in a position of one surface retaining the inner unit 440, which is observable through the opening 442 of the inner unit 440 from the one surface. The opening 456 is a through hole through which at least the area of the inner unit 440 on which the reference mark 424 is formed can be observed from the side opposite to the surface fitting the socket for adjustment 430.

Here, the socket for adjustment 430 fits the outer unit 450, to fix the position of the outer unit 450, as well as fixing the position of the inner unit 440 by the inner wall of the opening 436. When the outer unit 450 includes a lock mechanism for retaining the inner unit 440, the socket for adjustment 430 fits the outer unit 450 as well as unlocking the lock mechanism to set the inner unit 440 to be movable, and fixes the position of the inner unit 440 by the inner wall of the opening 436.

The socket-for-adjustment image-capturing section 322 captures an image of the socket for adjustment 430 and the actuator fitting unit 410 fitted each other, from the side of the front surface of the tray for adjustment 20 through the through hole 324. The socket-for-adjustment position detecting section 342 detects the relative position between the socket for adjustment 430 and the actuator fitting unit 410, based on the image-capturing result of the socket-for-adjustment image-capturing section 322.

Since the socket for adjustment 430 fixes the position of the inner unit 440 and the outer unit 450, the socket-for-adjustment position detecting section 342 can detect not only the relative position between the socket for adjustment 430 and the outer unit 450 but also the relative position with respect to the inner unit 440. That is, the socket-for-adjustment position detecting section 342 detects the position of the reference mark 454 of the outer unit 450 and the position of the reference mark 444 of the inner unit 440 respectively, to detect the relative position between the reference mark 454 and the reference mark 444.

In addition, the socket-for-adjustment position detecting section 342 has obtained the first correlation with respect to the test socket 122, and therefore can also determine the position of the reference mark 454 in the test socket 122, by detecting the position of the reference mark 454 of the outer unit 450. In this case, the socket-for-adjustment position detecting section 342 may determine the position of the reference mark 454 in the test socket 122, according to the relative position from the reference mark 434 of the socket for adjustment 430 to the reference mark 454 of the outer unit 450.

Figure 16:
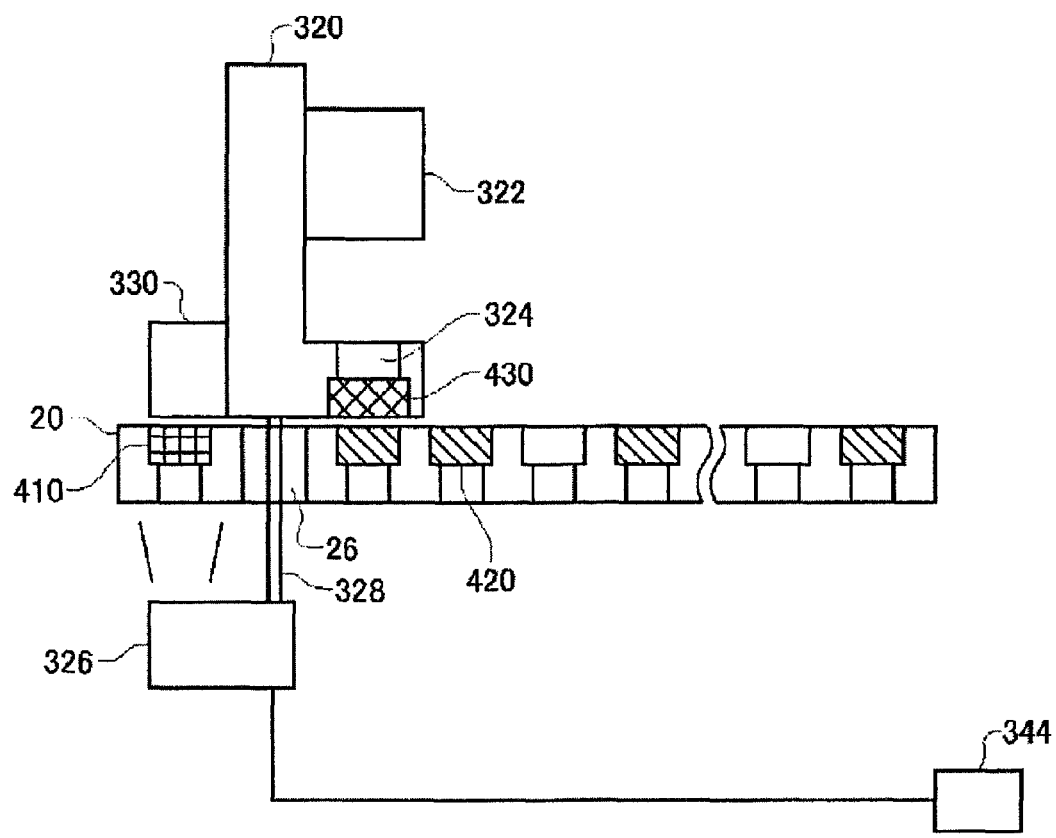
FIG. 16 shows an exemplary configuration in which the actuator fitting unit 410 according to the present embodiment has fitted the actuator 330.

Next, the handler apparatus 100 makes the actuator 330 fit the actuator fitting unit 410, to obtain the actuator coordinates being the initial position of the actuator 330 (S740). FIG. 16 shows an exemplary configuration in which the actuator fitting unit 410 according to the present embodiment has fitted the actuator 330.

The actuator image-capturing section 326 captures an image of the actuator 330 and the actuator fitting unit 410 from the side of the actuator fitting unit 410, in the state in which the actuator 330 fits the actuator fitting unit 410. Here, the actuator image-capturing section 326 may sequentially capture an image of the plurality of actuator fitting units 410 fitting the actuators 330, from the rear side of the tray for adjustment 20. The actuator adjusting section 348 adjusts the amount of driving of the actuator 330 based on the image-capturing result of the actuator image-capturing section 326 and the socket-for-adjustment image-capturing section 322.

Figure 17:
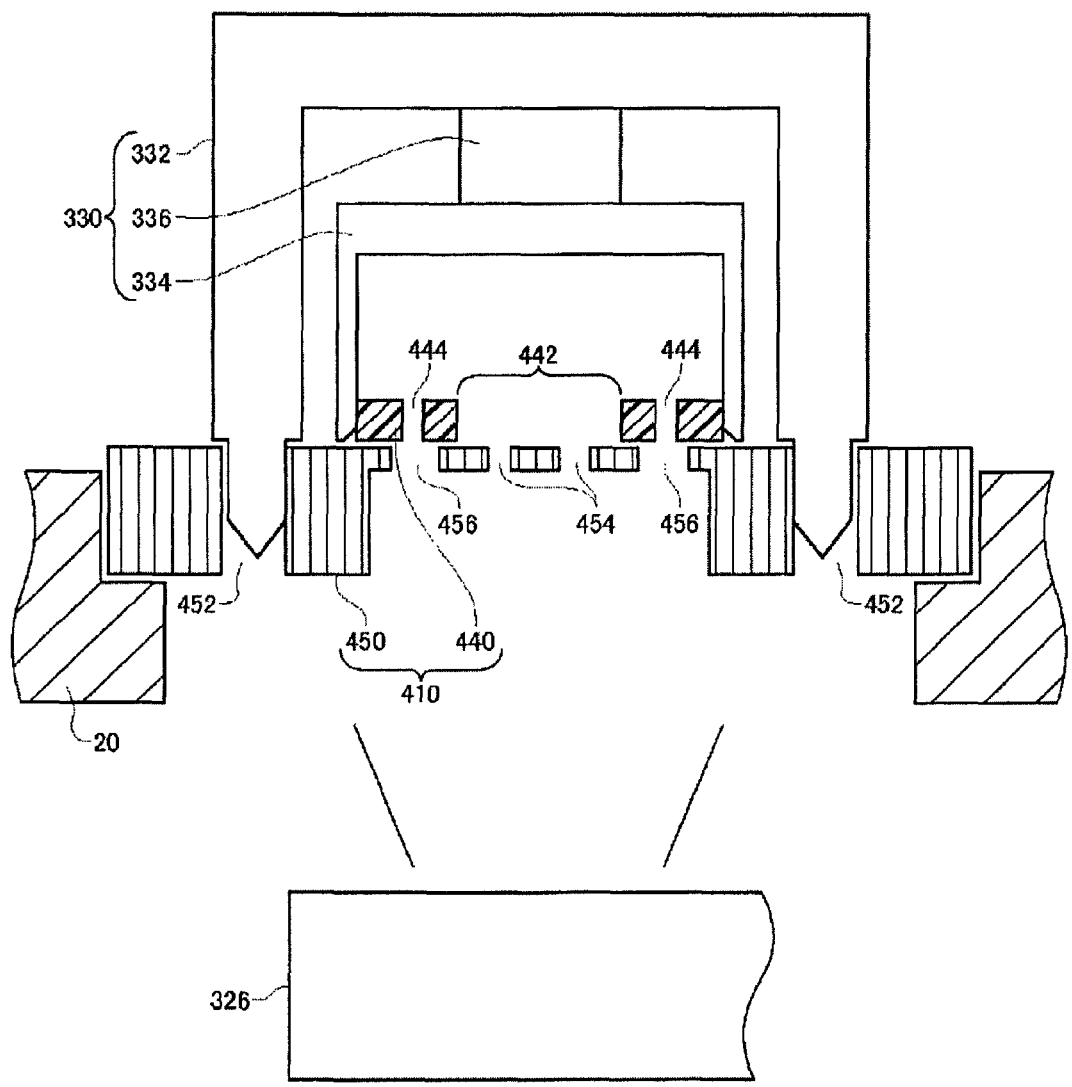
FIG. 17 shows an exemplary configuration in which an actuator image-capturing section 326 according to the present embodiment captures an image of the actuator fitting unit 410 and the actuator 330 fitting each other.

FIG. 17 shows an exemplary configuration in which an actuator image-capturing section 326 captures an image of the actuator fitting unit 410 and the actuator 330 fitting each other. Here, the actuator 330 includes an outer catch section 332, an inner catch section 334, and an actuator driving section 336.

The outer catch section 332 grasps the outer unit 450 of the actuator fitting unit 410. The outer catch section 332 has a shape that is the same as the shape of the socket pin 124, and grasps the outer unit 450 by fitting the pin insertion section 452 of the outer unit 450.

The inner catch section 334 grasps the inner unit 440. When the outer unit 450 includes a lock mechanism for retaining the inner unit 440, the inner catch section 334 releases the lock provided in the inner unit 440 while grasping the inner unit 440, and sets the inner unit 440 to be movable with respect to the outer unit 450, and thereafter grasps the inner unit 440. The inner catch section 334 may have a shape that is the same as the shape of the inner wall of the opening 436 of the socket for adjustment 430, and grasps the inner unit 440 in response to the outer catch section 332 grasping the outer unit 450.

The actuator driving section 336 is fixed to the outer catch section 332, and moves the inner catch section 334. The actuator driving section 336 moves the inner catch section 334 in accordance with the amount of adjustment instructed by the actuator adjusting section 348. First, the actuator adjusting section 348 may set, as the initial position, the inner catch section 334 grasping the inner unit 440. Here, in an example, the initial position of the inner catch section 334 may be determined to position the inner unit 440 to the central portion on the outer unit 450.

The actuator adjusting section 348 can detect the positional difference of the initial position of the inner catch section 334 with respect to the outer catch section 332, by detecting the relative position between the reference mark 454 of the outer unit 450 and the reference mark 444 of the inner unit 440. In addition, the actuator adjusting section 348 drives the actuator 330 in the state fitting the actuator fitting unit 410, and adjusts the amount of driving of the actuator 330 in the case of adjusting the position of the device under test 12 on the device holder 30, based on the distance and direction in which the actuator 330 has actually moved.

That is, the actuator adjusting section 348 drives the inner catch section 334, and adjusts the amount of driving based on the distance and direction in which the inner catch section 334 has actually moved. Here, the actuator adjusting section 348 may detect the distance and direction in which the inner catch section 334 has actually moved, in accordance with the amount of moving of the inner catch section 334 from the initial position.

In addition, the actuator adjusting section 348 may detect the distance and direction in which the inner catch section 334 has actually moved, by comparing the image-capturing results of the actuator image-capturing section 326 and the socket-for-adjustment image-capturing section 322. That is, the actuator adjusting section 348 adjusts the amount of driving for the actuator 330, based on the amount of positional difference of the actuator fitting unit 410, between when the actuator fitting unit 410 fits the socket for adjustment 430 and when the actuator fitting unit 410 fits the actuator 330.

The control section 340 obtains the first correlation and the second correlation in the handler apparatus 100, and then detects the initial position, the moving distance, the direction, or the like of the actuator 330. Therefore, it becomes possible to reduce the variation, error, or the like of the relative position of the actuator 330 with respect to the test socket 122, thereby driving the actuator 330 with accuracy. The control section 340 may adjust each actuator 330 separately and independently, by detecting the initial position, moving distance, direction, and the like of the plurality of actuators 330 respectively.

In response to obtaining the first correlation, the second correlation, and the coordinates of the actuator 330, the handler apparatus 100 completes the adjustment by the tray for adjustment 20, and discharges the tray for adjustment 20 (S750). Then, the handler apparatus 100 carries in the device tray 10 mounting thereon the device under test 12 (S760). The control section 340 causes the device tray 10 to be carried in the heating section 210 by the carry-in loader.

Next, the handler apparatus 100 causes the device holder 30 to fit the socket for adjustment 430, and obtains the device coordinates being the relative position between the device under test 12 and the test socket 122 (S770). That is, the socket for adjustment 430 fits the device holder 30 prior to causing the test socket 122 fit the device holder 30 retaining the device under test 12.

The socket-for-adjustment image-capturing section 322 captures an image of the socket for adjustment 430 and the device under test 12, in the state in which the device holder 30 fits the socket for adjustment 430. The socket-for-adjustment position detecting section 342 detects the relative position of the device under test 12 with respect to the socket for adjustment 430 based on the image-capturing result of the socket-for-adjustment image-capturing section 322.

Figure 18:
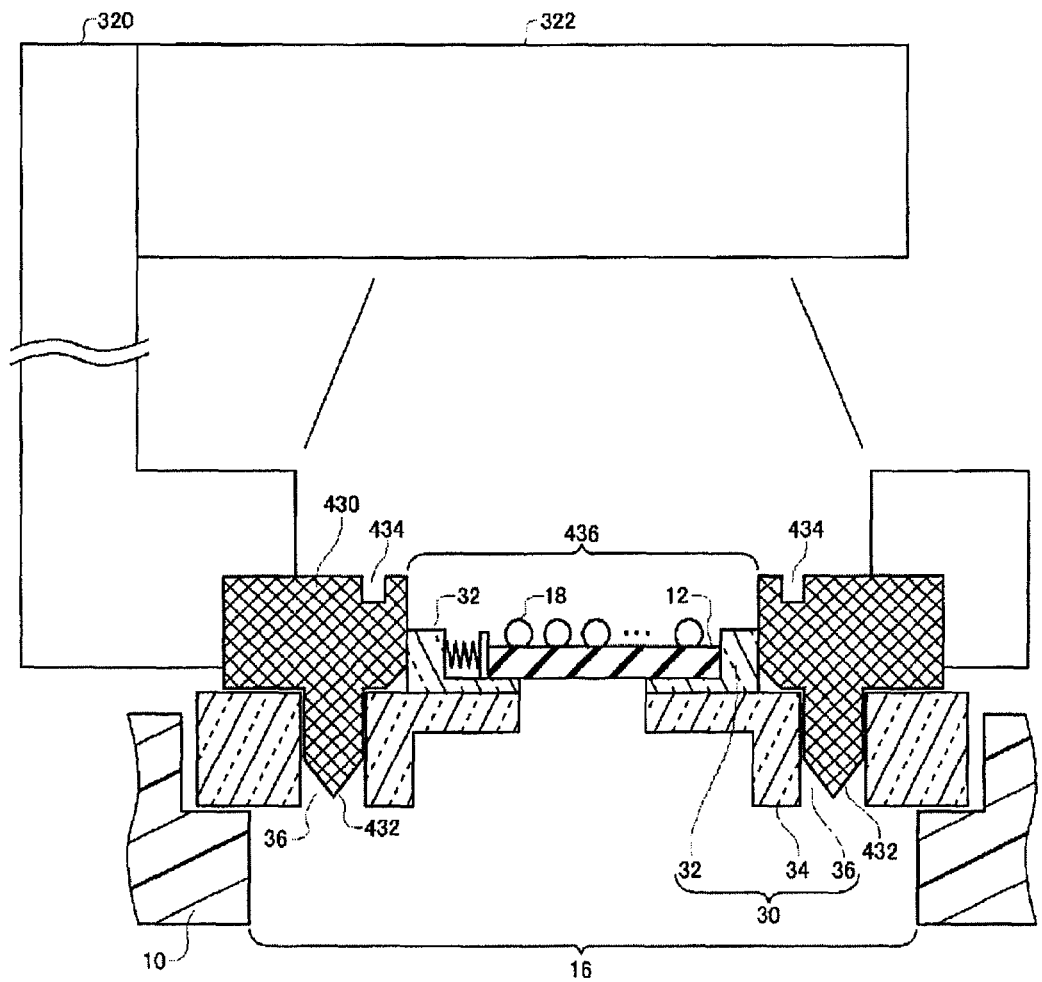
FIG. 18 an exemplary configuration in which the socket-for-adjustment image-capturing section 322 according to the present embodiment captures an image of the socket for adjustment 430 and a device holder 30 fitting each other.

FIG. 18 an exemplary configuration in which the socket-for-adjustment image-capturing section 322 according to the present embodiment captures an image of the socket for adjustment 430 and a device holder 30 fitting each other. The socket pin 432 fits the pin insertion section 36 of the outer unit 34, and the inner unit 32 is fixed by the inner wall of the opening 436 of the socket for adjustment 430. When the outer unit 34 includes a lock mechanism for retaining the inner unit 32, the socket for adjustment 430 fits the outer unit 34 and releases the lock mechanism, to set the inner unit 32 to be movable, and then fixes the inner unit 32 by the inner wall of the opening 436.

The socket-for-adjustment image-capturing section 322 captures an image of the area including at least a part of the electrodes 18 of the device under test 12 and the reference mark 434 of the socket for adjustment 430, from the surface opposite to the surface of the socket for adjustment 430 fitting the device holder 30. The socket-for-adjustment position detecting section 342 detects the relative position of the electrodes 18 of the device under test 12 with respect to the socket for adjustment 430. Alternatively, the socket-for-adjustment position detecting section 342 may detect the relative position of the electrodes 18 of the device under test 12 with respect to the reference mark 434 of the socket for adjustment 430.

The socket-for-adjustment position detecting section 342 detects the relative position between the inner unit 32 and the test socket 122, based on the positional difference between the inner unit 440 of the actuator fitting unit 410 and the inner unit 32 of the device holder 30 caused between when the actuator fitting unit 410 fits the socket for adjustment 430 and when the device holder 30 fits the socket for adjustment 430. The socket-for-adjustment position detecting section 342 can detect the relative position between the electrodes 18 of the device under test 12 and the test socket 122, from the relative position between the inner unit 32 and the electrode 18 and the relative position between the inner unit 32 and the test socket 122.

That is, the socket-for-adjustment position detecting section 342 can obtain the device coordinates being the relative position between the electrode 18 of the device under test 12 and the electrode 126 of the test socket 122, when the device holder 30 fits the test socket 122. According to the device coordinates, the control section 340 can determine the position in which the device under test 12 is to be positioned on the device holder 30, so that the electrode 18 is electrically connected to the electrode 126, when the device holder 30 fits the test socket 122.

The conveyer 240 and/or the actuator unit 320 moves the device tray 10 so that the socket-for-adjustment position detecting section 342 can detect the relative positions between at least one actuator fitting unit 410 and the plurality of device holders 30 respectively. For example, the control section 340 controls the conveyer 240 and/or the actuator unit 320 to sequentially cause all the device holders 30 on the device tray 10 to fit the socket for adjustment 430, and determines the positions to which all the devices under test 12 are to be arranged.

Next, the handler apparatus 100 causes the device holder 30 to fit the actuator 330, and adjusts the position of the device under test 12 on the device holder 30 (S780). The control section 340 controls the conveyer 240 and/or the actuator unit 320 so that the device holder 30 aligned on a predetermined column of the device tray 10 fits the actuator 330 of the actuator unit 320.

The actuator adjusting section 348 obtains the correlation between the positions of the device holder 30 and the actuator fitting unit 410 from the detection result of the socket-for-adjustment position detecting section 342, and determines the adjusted position of the inner unit 32 (i.e., device under test 12) according to the device coordinates. That is, the actuator 330 adjusts the position of the device under test 12 on the device holder 30, based on the relative position of the device holder 30 with respect to the socket for adjustment 430 in the state in which the socket for adjustment 430 fits the device holder 30 and the relative position of the socket fitting unit 420 with respect to the socket for adjustment 430 in the state in which the socket for adjustment 430 fits the socket fitting unit 420.

Figure 19:
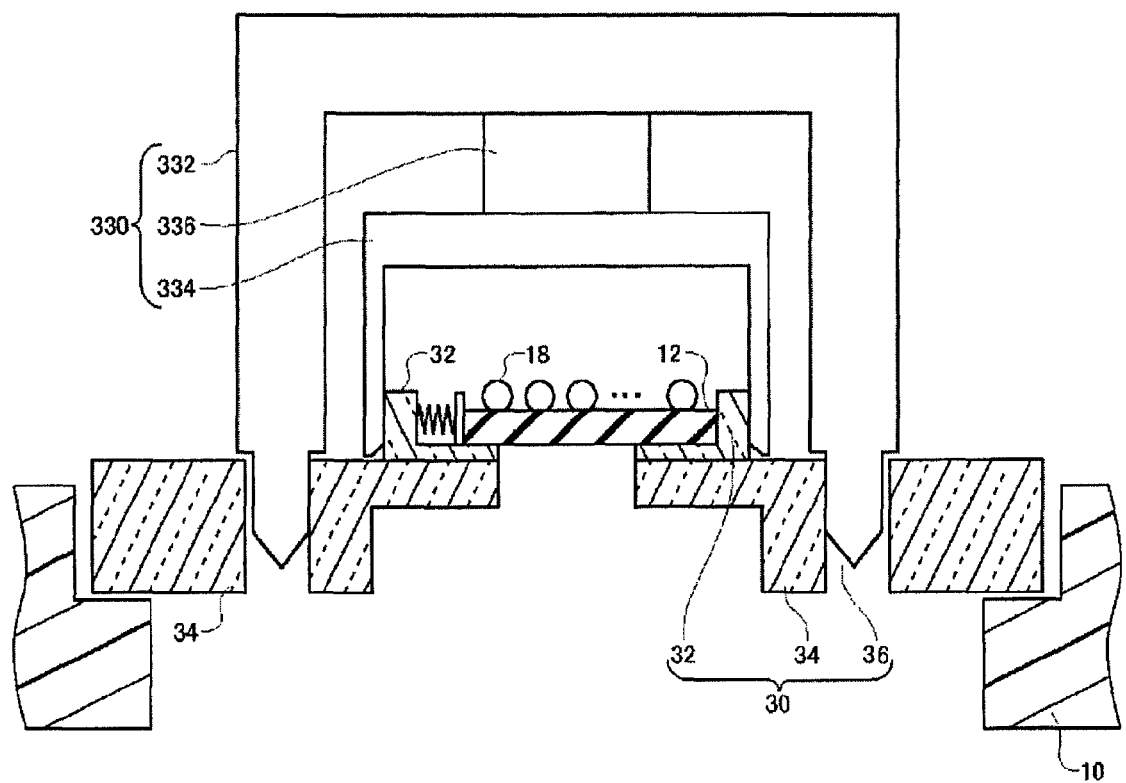
FIG. 19 shows an exemplary configuration in which the actuator 330 according to the present embodiment has fitted the device holder 30.

FIG. 19 shows an exemplary configuration in which the actuator 330 according to the present embodiment has fitted the device holder 30. The outer catch section 332 grasps the pin insertion section 36 of the device holder 30, as well as the inner catch section 334 grasping the inner unit 32. When the outer unit 34 includes a lock mechanism for retaining the inner unit 32, the outer catch section 332 grasps the outer unit 34, as well as release the lock mechanism to make the inner unit 32 to be movable, and then the inner catch section 334 grasps the inner unit 32.

The inner catch section 334 is driven by the actuator driving section 336, to move the inner unit 32 to the adjusted position determined by the actuator adjusting section 348. In this way, the actuator 330 can adjust the position of the device under test 12 on the device holder 30, based on the amount of positional difference (i.e., device coordinates) of the device holder 30 to be caused between when the device holder 30 fits the test socket 122, and when the device holder 30 fits the socket for adjustment 430.

The control section 340 controls the actuator unit 320 so that the devices under test 12 on all the device holders 30 aligned in the predetermined columns of the device tray 10 are adjusted by the actuator 330. In addition, the control section 340 controls the conveyer 240 and/or the actuator unit 320 so that the devices under test 12 on the device holders 30 aligned in the other columns of the device tray 10 are adjusted by the actuator 330.

That is, the control section 340 sequentially moves the actuator unit 320 so that the actuators 330 can be positioned in predetermined positions respectively corresponding to the plurality of device holders 30. The actuator unit 320 sequentially moves the device holder 30 and the actuator 330 aligned in the column corresponding to the predetermined position to fit each other, each time it moves to the predetermined position on the device tray 10, and the actuator 330 adjusts the positions of the plurality of devices under test 12 retained by the plurality of device holders 30 respectively.

Next, the handler apparatus 100 conveys the device under test 12 to the test section 220 (S790). Here, the handler apparatus 100 may convey the device under test 12 after heating the device under test 12 by the temperature control section 212. Alternatively, the handler apparatus 100 may heat the device under test 12 after the device tray 10 is carried in the heating section 210.

The conveyer 240 conveys the device holder 30 on which the position of the device under test 12 has been adjusted, to cause it to fit the test socket 122. Since the actuator 330 has adjusted the position of the device under test 12, the electrode 18 of the device under test 12 can be electrically connected to the electrode 126 of the test socket 122, as shown in FIG. 2.

Next, the test apparatus connected to the handler apparatus 100 executes a test of the device under test 12 (S800). The handler apparatus 100 discharges the device tray 10 in response to ending of the test (S810).

According to the handler apparatus 100 of the present embodiment described above, the relative position between the device under test 12 and the test socket 122 is detected and adjusted, prior to causing the device holder 30 retaining the device under test 12 to fit the test socket 122, and therefore electrical connection between the test apparatus and the device under test 12 can be assured to a greater extent. In addition, prior to fitting of the actuator 330 and the device holder 30, the relative position, driving direction, and amount of driving of the actuator 330 are adjusted, which improves the position accuracy and the driving accuracy of the actuator, and it becomes possible to adjust the position of the device under test 12 with accuracy.

As described above, the handler apparatus 100 according to the present embodiment performs adjustment by means of the tray for adjustment 20, by obtaining the socket coordinates by causing the socket fitting unit 420 to fit the test socket 122, obtaining the first correlation by causing the socket fitting unit 420 to fit the socket for adjustment 430, obtaining the second correlation by causing the socket for adjustment 430 to fit the actuator fitting unit 410, and adjusting the actuator 330 by causing the actuator fitting unit 410 to fit the actuator 330, in the stated order. Alternatively, the handler apparatus 100 may perform adjustment while transporting the tray for adjustment 20 from the heating section 210 to the test section 220.

That is, the handler apparatus 100 carries the tray for adjustment 20 into the heating section 210, causes the socket for adjustment 430 to fit the actuator fitting unit 410, and subsequently causes the actuator fitting unit 410 to fit the actuator 330, thereby adjusting the actuator from the relative position between the actuator fitting unit 410 and the actuator 330. Then, the socket fitting unit 420 is caused to fit the socket for adjustment 430, and the relative position between the actuator fitting unit 410 and the socket fitting unit 420 is detected.

Next, the tray for adjustment 20 is conveyed to the test section 220, and the socket fitting unit 420 is caused to fit the test socket 122, and the first correlation and the second correlation are obtained. Accordingly, the handler apparatus 100 can execute the adjustment by the tray for adjustment 20, and therefore the tray for adjustment 20 can be discharged to outside of the handler apparatus 100 via the heat removing section 230. As stated above, the handler apparatus 100 can execute the adjustment by the tray for adjustment 20 appropriately, even when the order of detection of the relative position of each portion is changed.

In the handler apparatus 100 according to the present embodiment, both of the relative position of the device under test 12 with respect to the socket for adjustment 430 and the relative position of the test socket 122 with respect to the socket fitting unit 420 are detected so as to detect the amount of positional difference between the device under test 12 and the test socket 122. When one of the above-described relative positions is known, the handler apparatus 100 may omit detection of the other of the above-described relative positions. For example, the handler apparatus 100 may omit detection of the relative position of the test socket 122 from the subsequent test, by using the already detected relative position of the test socket 122 from the subsequent test of the device tray 10. It is also possible to omit one of the detection of the above-described relative positions, by using information on the relative position inputted by a user or the like.

The outer unit 34 according to the present embodiment was explained to include a lock mechanism for retaining the inner unit 32. The following explains the details of this lock mechanism with reference to FIG. 20 through FIG. 24.

Figure 20:
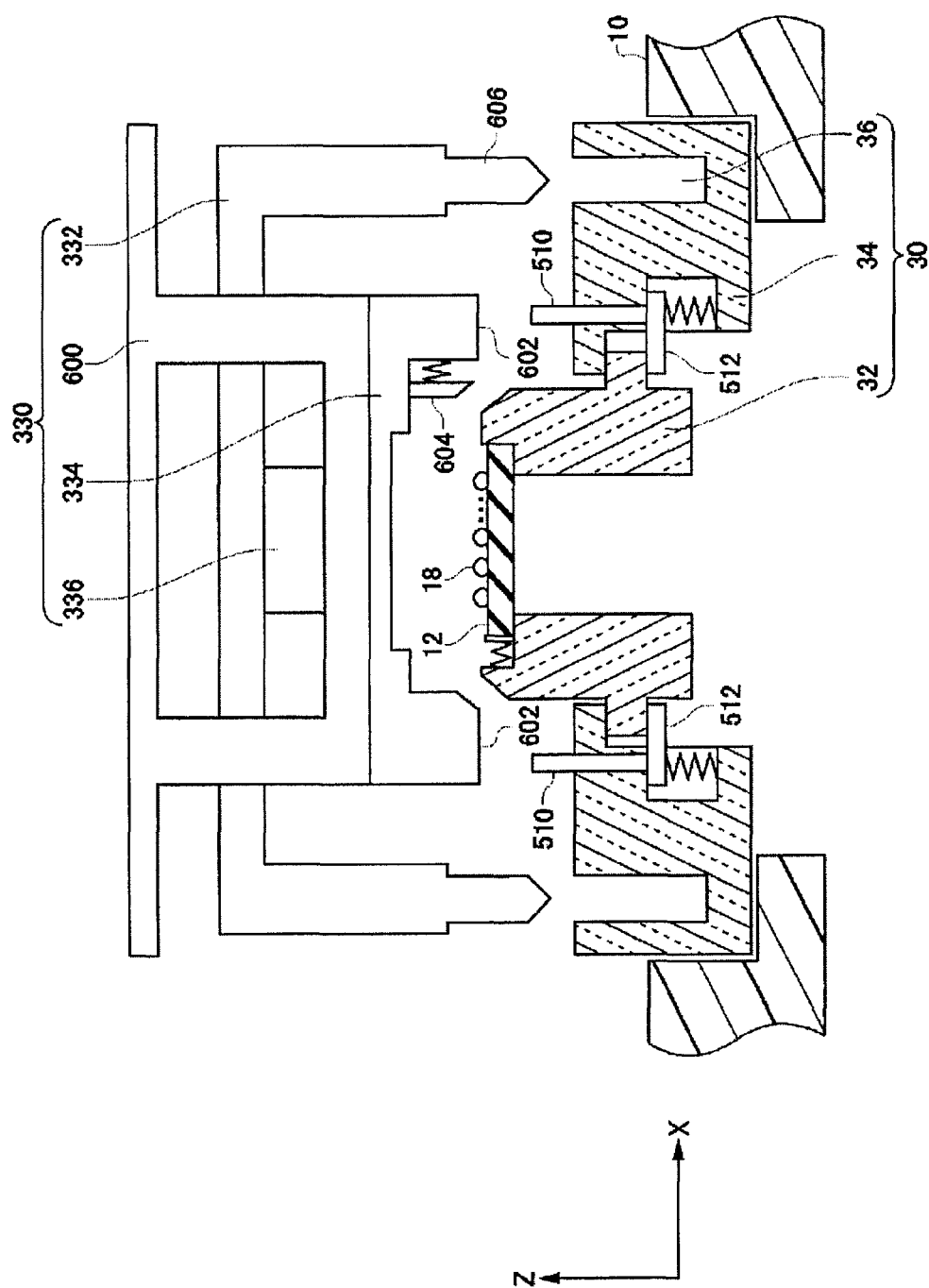
FIG. 20 shows a first example of an actuator 330 and a device holder 30 having a lock mechanism according to the present embodiment.

FIG. 20 shows a first example of an actuator 330 and a device holder 30 having a lock mechanism according to the present embodiment. In FIG. 20, mutually orthogonal XYZ axes are shown. FIG. 19 shows an example of an actuator 330 in which the inner catch section 334 grasps the inner unit 32 for movement, while FIG. 20 shows an example in which the outer catch section 332 grasps the outer unit 34 for movement. The outer unit 34 of the first example includes a release button 510 and an insert latch 512.

The release button 510 releases the lock of movement of the inner unit 32, in response to being pushed from a side to which the device under test 12 is mounted. For example, the release button 510 releases the lock in response to being pushed down in −Z direction. In this case, the release button 510 locks the movement of the inner unit 32 in response to returning to the initial position in response to release of the push down in −Z direction. There may be a plurality of release buttons 510 provided in the outer unit 34.

The insert latch 512 is connected to the release button 510, grasps a portion of the inner unit 32, and releases the grasping of the portion of the inner unit 32 in response to push of the release button 510. For example, the insert latch 512 is biased in +Z direction by an elastic member such as a spring of the outer unit 34, thereby grasping (that is, locking) a portion of the inner unit 32 in the +Z direction when the release button 510 is not pushed and is positioned in the initial position. In this case, in response to push down of the release button 510 in −Z direction, the grasping of the inner unit 32 is released (that is, the lock is released).

The actuator 330 of the first example releases the lock set in the inner unit 32 in the state in which the inner catch section 334 grasps the inner unit 32, to enable the inner unit 32 to be relatively movable with respect to the outer unit 34. The actuator 330 further includes a pedestal 600.

The pedestal 600 is connected to the actuator unit 320, and fixes the actuator 330. In an example, the pedestal 600 fixes the inner catch section 334 on a surface facing the device under test 12. In addition, the pedestal 600 fixes the outer catch section 332 via the actuator driving section 336. That is, the actuator 330 drives the actuator driving section 336, to relatively move the outer catch section 332 with respect to the fixed inner catch section 334. The inner catch section 334 of the first example includes a pressing section 602 and a latch section 604.

The pressing section 602 faces against the release button 510 of the outer unit 34, and presses the release button 510 as a result of fitting of the actuator 330 to the device holder 30. A plurality of the pressing sections 602 may be provided to correspond to the plurality of release buttons 510, and the lock of the inner unit 32 is released as a result of fitting of the actuator 330 and the device holder 30.

The latch section 604 grasps the inner unit 32. The latch section 604 includes an elastic member such as a spring which biases so as to grasp the inner unit 32. The latch section 604 grasps the inner unit 32 in a predetermined position of the inner catch section 334, as a result of fitting of the actuator 330 and the device holder 30. That is, the latch section 604 grasps the inner unit 32 being set to be movable as a result of release of the lock.

In an example, corners of the latch section 604 and the inner catch section 334, which face the inner unit 32, are chamfered to shape slope faces. In addition, corresponding corners of the inner unit 32, which face the inner catch section 334, may be chambered to shape slope faces. As a result, the slope face of the latch section 604 contacts the inner unit 32, in the process in which the actuator 330 approaches the device holder 30 to contact therewith, to guide the inner unit 32 to move to a predetermined position of the inner catch section 334.

The latch section 604 of FIG. 20 shows an example that has a spring that biases in −X direction, and grasps a side surface vertical to the X direction of the inner unit 32. There may be a plurality of latch sections 604 provided at the inner catch section 334. For example, when the inner unit 32 has a square shape having the four sides in a plane parallel to the XY plane, two latch sections 604 may be provided to correspond to two sides out of the four sides.

In addition, the outer catch section 332 includes a fitting pin 606, and grasps the outer unit 34 by fitting the pin insertion section 36 of the outer unit 34. The fitting pin 606 has substantially the same shape as the shape of the socket pin 124.

Figure 21:
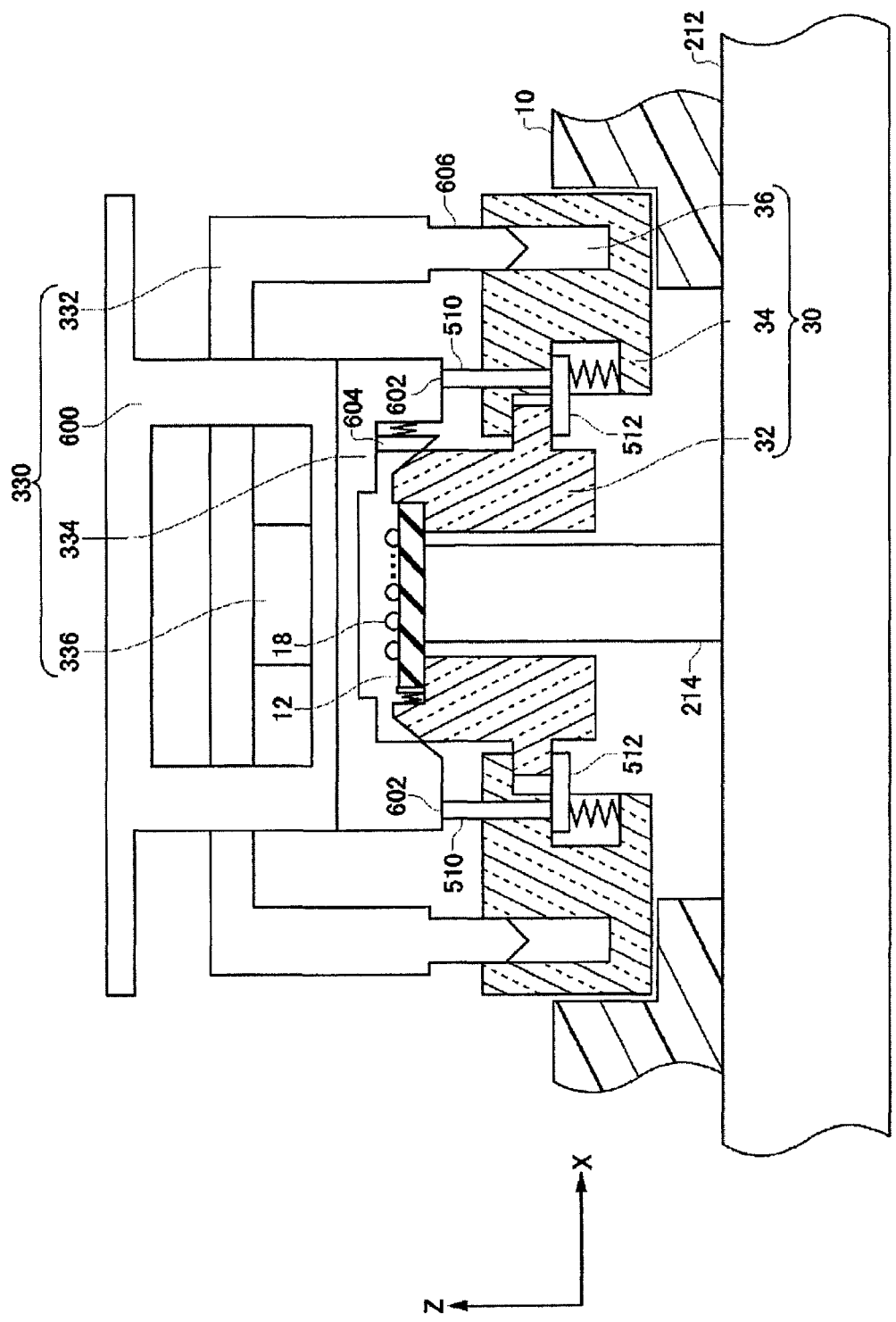
FIG. 21 shows an exemplary configuration of a process in which the actuator 330 and the device holder 30 shown in FIG. 20 fit each other.

FIG. 21 shows an exemplary configuration of a process in which the actuator 330 and the device holder 30 shown in FIG. 20 fit each other. That is, FIG. 21 shows an exemplary configuration in which the actuator unit 320 moves in −Z direction towards the device holder 30, to cause the actuator 330 and the device holder 30 to approach each other. In FIG. 21, the inner catch section 334 guides the inner unit 32 to grasp it, and the outer catch section 332 guides the outer unit 34 to grasp it.

For example, the device holder 30 is mounted to be movable on the device tray 10, so that it can be grasped by the actuator 330 on the XY plane. Instead of this, or in addition to this, in the actuator driving section 336, driving of the outer catch section 332 may be stopped, and the outer catch section 332 may be movable on the XY plane. In this way, as a result of insertion of the tip of the fitting pin 606 into the pin insertion section 36 of the outer unit 34, the outer unit 34 and/or the outer catch section 332 move so that the fitting pin 606 fits the pin insertion section 36.

In addition, in an example, the inner catch section 334 guides the inner unit 32 as a result of the slope face formed by removing the corner portion facing the inner unit 32 contacting the inner unit 32. In this case, the latch section 604 moves in X direction to contact and grasp the inner unit 32.

During a process in which the actuator 330 and the device holder 30 fit each other, the temperature control section 212 may contact a rear surface that is opposite to the actuator 330 of the device tray 10. In this case, the temperature control unit 214 of the temperature control section 212 may contact the rear surface opposite to the actuator 330 of the device under test 12. Accordingly, the temperature control section 212 can stably retain the device tray 10 on which the device holder 30 is mounted. In addition, the temperature control unit 214 can quickly start temperature control of the device under test 12.

In addition, the temperature control section 212 can position, to a predetermined position, the position in Z direction of the device holder 30 automatically. In an example, a stopper or the like may be combined, so that the temperature control section 212 may move the device holder 30 in a predetermined position in Z direction with reference to the position of the stopper. In addition, the temperature control section 212 may include an absorption section adsorbing the device holder 30 or the device under test 12 on a surface facing the device holder 30. In this case, the temperature control section 212 adsorbs either the device holder 30 or the device under test 12, to remove the device holder 30 having fitted the actuator 330, by movement of the actuator unit 320 in a direction apart from the device holder 30 (i.e., Z direction).

Figure 22:
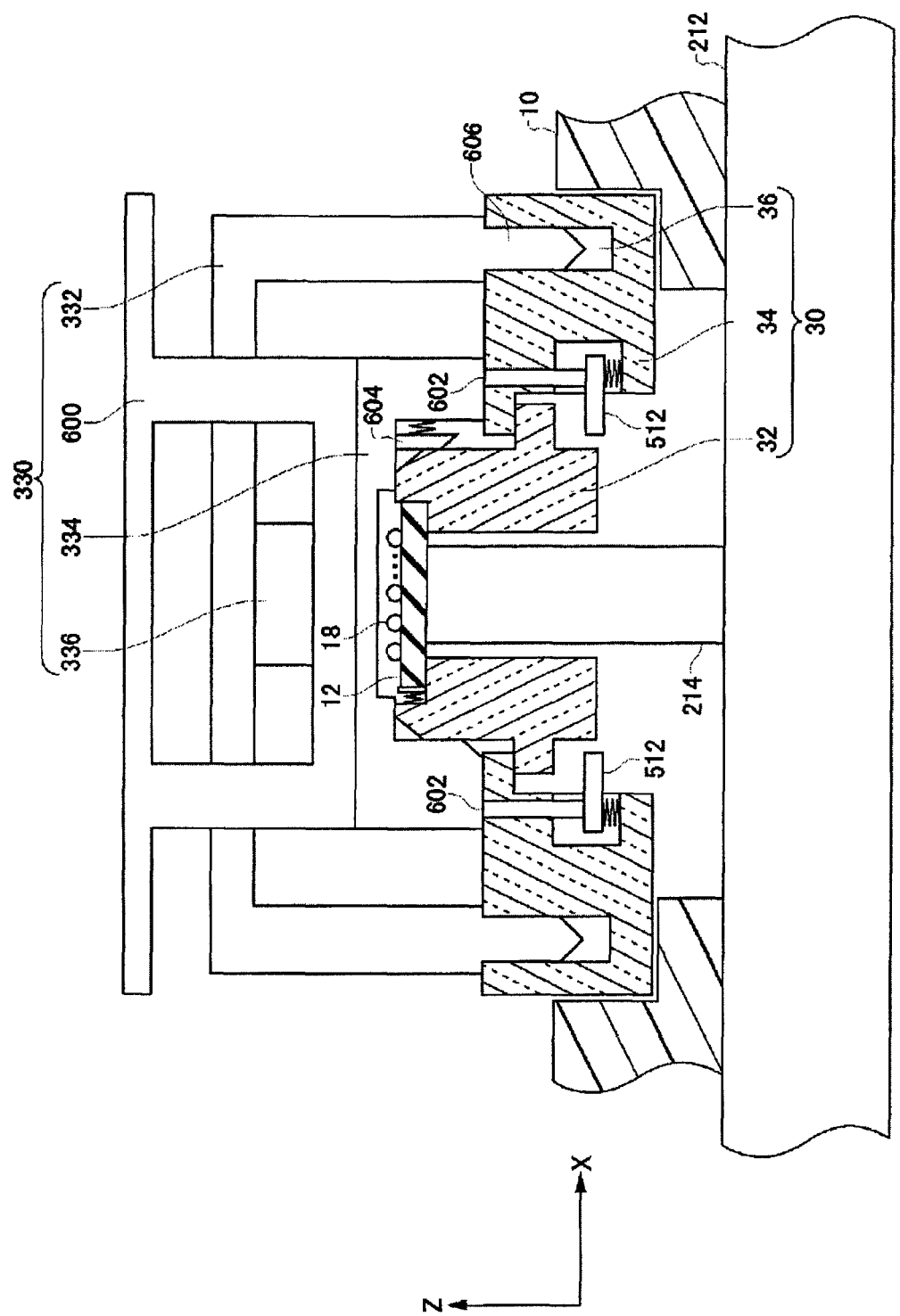
FIG. 22 shows an exemplary configuration in which the actuator 330 and the device holder 30 shown in FIG. 20 fit each other.

FIG. 22 shows an exemplary configuration in which the actuator 330 and the device holder 30 shown in FIG. 20 fit each other. That is, FIG. 21 shows an exemplary configuration in which the actuator unit 320 further moves in −Z direction towards the device holder 30, thereby causing the actuator 330 to contact the device holder 30. In FIG. 22, the inner catch section 334 grasps the inner unit 32, and the outer catch section 332 grasps the outer unit 34.

That is, the fitting pin 606 of the outer catch section 332 fits the pin insertion section 36 of the outer unit 34. The pressing section 602 of the inner catch section 334 presses the release button 510, to release the lock of the inner unit 32. The latch section 604 grasps the inner unit 32 set to be movable as a result of the release of the lock.

As stated above, as a result of fitting of the actuator 330 and the device holder 30 according to the present embodiment, the inner catch section 334 grasps the inner unit 32 whose lock has been released, and the outer catch section 332 grasps the outer unit 34. Then, the actuator 330 drives the actuator driving section 336, to move the outer catch section 332 while grasping and fixing the inner unit 32, to adjust the relative position of the inner unit 32 on the device holder 30. That is, the actuator 330 can adjust the position of the device under test 12 on the device holder 30.

In addition, by distancing of the actuator 330 from the device holder 30, the outer catch section 332 locks the movement of the inner catch section 334, and fixes the inner unit 32 in a position on the device holder adjusted by the actuator 330. Accordingly, the device under test 12 can be electrically connected to a test apparatus, by being fixed to an adjusted position on the device holder 30, and by the conveyer 240 conveying the device trainer 30 to fit the test socket 122.

Figure 23:
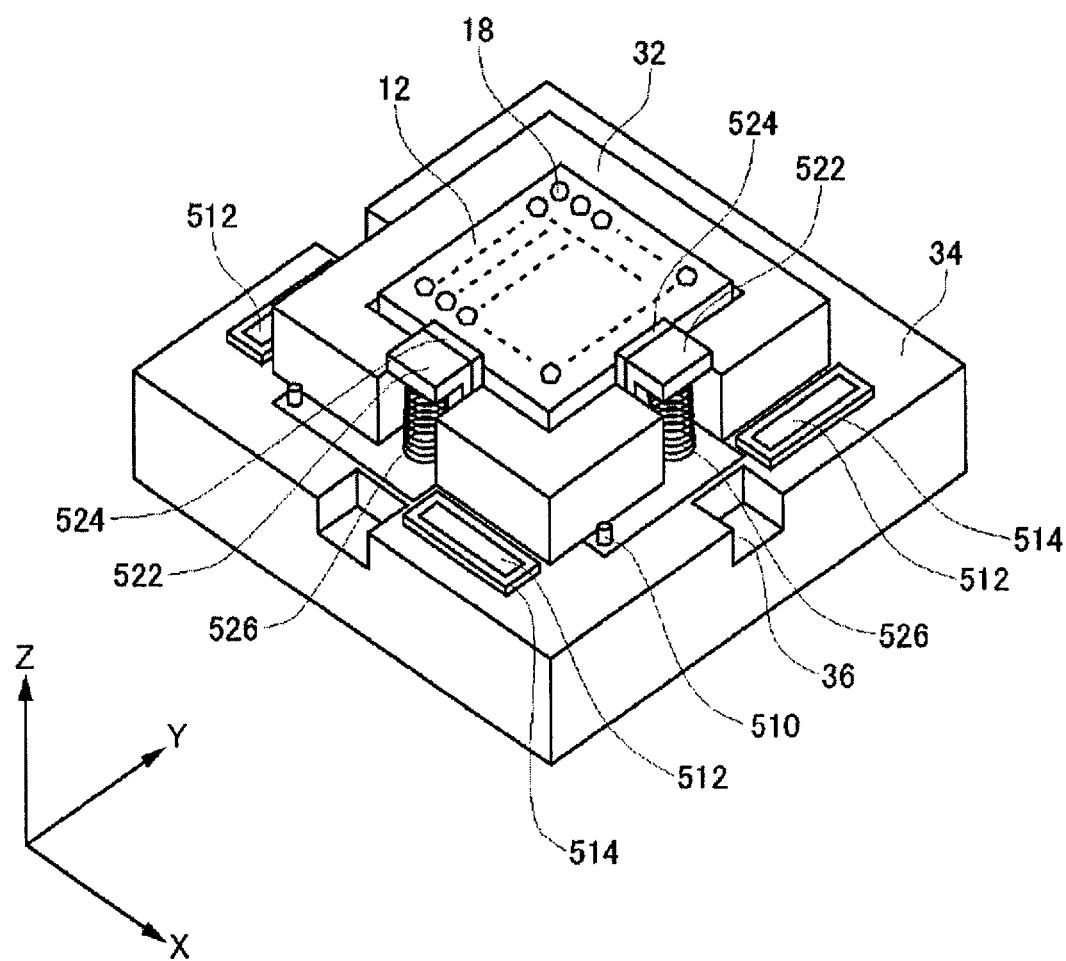
FIG. 23 shows a second example of the device holder 30 having a lock mechanism according to the present embodiment.

FIG. 23 shows a second example of the device holder 30 having a lock mechanism according to the present embodiment. The device holder 30 of the second example of the present embodiment grasps a portion of the outer unit 34.

The outer unit 34 of FIG. 23 includes pin insertion sections 36 grasped by the outer catch section 332 at three sides out of the four sides surrounding the inner unit 32. Instead of this, the outer unit 34 may include pin insertion sections 36 at four sides surrounding the inner unit 32. Instead, the outer unit 34 may include pin insertion sections 36 at two sides out of the four sides surrounding the inner unit 32.

The pin insertion section 36 may have a sectional form parallel to the XY plane, which is square, or alternatively circular or ellipsoidal. In addition, the pin insertion section 36 may be a hole having a predetermined depth (counterbore having a bottom portion), or alternatively a through hole.

The inner unit 32 of FIG. 23 includes device latches 522 grasping the device under test 12 respectively at two sides of the device under test 12. For example, the device latch 522 fixes the device under test 12 by pressing the side surface of the device under test 12. Instead of this or in addition to this, the device latch 522 may fix the device under test 12 by pressing the upper surface of the device under test 12, which faces the test socket 122. The device latch 522 may be provided with a silicon cover 524, at a portion grasping the device under test 12.

FIG. 23 shows an example in which the device latch 522 has a rotation axis substantially parallel to X axis or Y axis, and includes a spring 526 biasing to rotate in Y direction or X direction. That is, in the device holder 30 in FIG. 23, the spring 526 biases in Z axis direction, to press the side surface and the upper surface of the device under test 12 by rotating the device latch 522, and consequently, the device under test 30 is fixed. This configuration enables to reduce the surface area parallel to the XY plane of the inner unit 32.

In addition, the device holder 30 includes a release button 510 and an insert latch 512, at at least one side out of the four sides surrounding the inner unit 32. The device holder 30 of FIG. 23 shows an example in which the release button 510 and the insert latch 512 are included in three sides out of the four sides surrounding the inner unit 32. Next, the configuration in which the device holder 30 of the second example grasps a portion of the outer unit 34 is explained with reference to FIG. 24.

Figure 24:
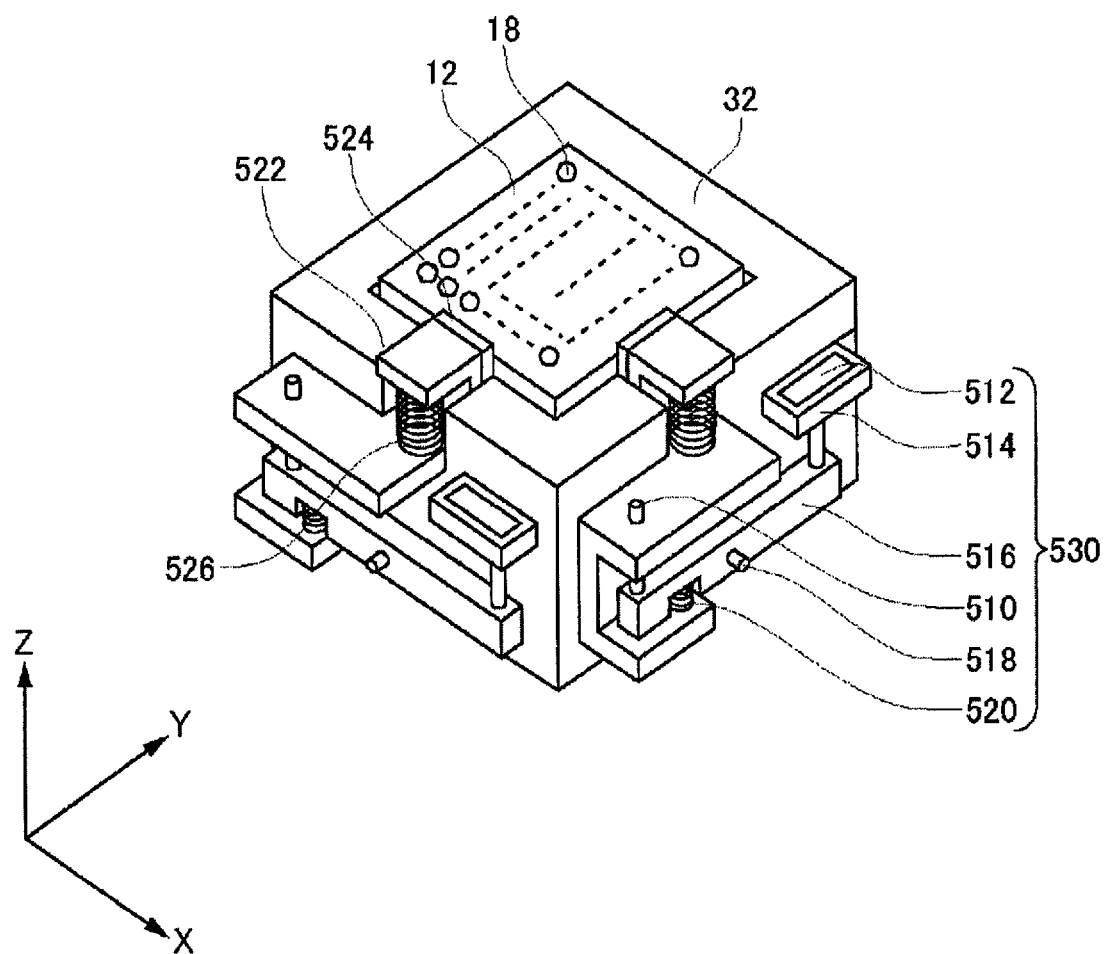
FIG. 24 shows an exemplary configuration of the device holder 30 shown in FIG. 23 from which the outer unit 34 has been removed.

FIG. 24 shows an exemplary configuration from which the outer unit 34 of the device holder 30 shown in FIG. 23 has been removed. The device holder 30 includes a lever section 530. The lever section 530 includes a release button 510, an insert latch 512, a silicon cover 514, a lever 516, a supporting point 518, and a spring 520.

The insert latch 512 grasps a portion of the outer unit 34. The insert latch 512 grasps a portion of the outer unit 34, from the side to which the device under test 12 is mounted (that is, towards −Z direction). The insert latch 512 may be provided with a silicon cover 514 at a portion thereof to grasp the outer unit 34.

When the release button 510 is pressed, the lever 516 transmits a pressed force to the insert latch 512/That is, the lever 516 transmits a force pressed in −Z direction, as a force to move the insert latch 512 in +Z direction via the supporting point 518. Therefore, the lever section 530 releases grasping of a part of the outer unit 34, as a result of the insert latch 512 moving in +Z direction in response to the release button 510 being pushed.

The spring 520 biases the lever 516. The spring 520 biases the lever 516 so as to move the release button 510 in Z direction. That is, when the release button 510 is not pressed, the release button 510 is positioned in a predetermined initial position. In addition, the release button 510 returns to the initial position in response to distancing of the actuator 330 from the device holder 30.

As a result of the above-described device holder 30 of the second example fitting the actuator 330, the inner catch section 334 grasps the inner unit 32, and the outer catch section 332 grasps the outer unit 34 whose lock has been released. Then, the actuator 330 drives the actuator driving section 336, to move the outer catch section 332 while grasping and fixing the inner unit 32, thereby adjusting the relative position of the inner unit 32 on the device holder 30. That is, the actuator 330 can adjust the position of the device under test 12 on the device holder 30.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A handler apparatus that conveys a device under test to a test socket, comprising:
　　an actuator that, prior to fitting of a device holder retaining the device under test to the test socket, fits the device holder, and adjusts a position of the device under test on the device holder; and
　　a conveyer that conveys the device holder in which a position of the device under test has been adjusted, to fit the test socket, wherein
　　the device holder includes:
　　　　an inner unit to mount the device under test;
　　　　an outer unit to retain the inner unit to be movable; and
　　　　a lever section including:
　　　　　　a release button to release a lock of movement of the inner unit, in response to being pressed from a side to which the device under test is mounted;

an insert latch that grasps a part of the outer unit, and releases the part of the outer unit in response to pressing of the release button; and a lever that, when the release button is pressed, transmits a pressed force to the insert latch, and the actuator sets the inner unit to be movable by pressing the release button and adjusts a position of the inner unit.

2. The handler apparatus according to claim 1, wherein the actuator includes:

an outer catch section that grasps the outer unit; and an inner catch section that grasps the inner unit, and releases a lock set to the inner unit while grasping the inner unit, to set the inner unit to be relatively movable with respect to the outer unit.

3. The handler apparatus according to claim 2, wherein the outer unit includes a pin insertion section grasped by the outer catch section, at three sides out of four sides surrounding the inner unit.

4. The handler apparatus according to claim 1, wherein the insert latch grasps a part of the outer unit from a side to which the device under test is mounted.

5. The handler apparatus according to claim 1, wherein a silicon cover is provided at a portion of the insert latch to grasp the outer unit.

6. The handler apparatus according to claim 1, wherein the lever section further includes a spring to bias the lever.

7. The handler apparatus according to claim 1, wherein the inner unit includes device latches grasping the device under test at two sides of the device under test respectively, in parallel to a surface of the device under test facing the test socket.

8. The handler apparatus according to claim 7, wherein a silicon cover is provided at a portion of the device latch to grasp the device under test.

9. A test apparatus that comprises the handler apparatus according to claim 1 for conveying the device under test to the test socket, the test apparatus testing the device under test and further comprising:

a test head to be electrically connected to the device under test via the test socket; and a test module testing the device under test via the test head.

10. A device holder for use in a handler apparatus that conveys a device under test to a test socket, the handler apparatus including an actuator that, prior to fitting of a device holder retaining the device under test to the test socket, fits the device holder, and adjusts a position of the device under test on the device holder, and a conveyer that conveys the device holder in which a position of the device under test has been adjusted, to fit the test socket, the device holder comprising:

an inner unit to mount a device under test;

an outer unit to retain the inner unit to be movable; and a lever section including:
　　a release button to release a lock of movement of the inner unit, in response to being pressed from a side to which the device under test is mounted;
　　an insert latch that grasps a part of the outer unit, and releases the part of the outer unit in response to pressing of the release button; and
　　a lever that, when the release button is pressed, transmits a pressed force to the insert latch, wherein the device holder mounts the device under test and fits the test socket by being conveyed by the conveyer.

\* \* \* \* \*